United States Patent
Yoo et al.

(10) Patent No.: US 12,027,508 B2
(45) Date of Patent: Jul. 2, 2024

(54) DISPLAY DEVICE AND METHOD FOR MANUFACTURING SAME

(71) Applicant: SAMSUNG DISPLAY CO., LTD., Yongin-si (KR)

(72) Inventors: Je Won Yoo, Yongin-si (KR); Dae Hyun Kim, Yongin-si (KR); Bek Hyun Lim, Yongin-si (KR); Myeong Hee Kim, Yongin-si (KR); Chang Il Tae, Yongin-si (KR); Hyun Min Cho, Yongin-si (KR); Keun Kyu Song, Yongin-si (KR); Jin Oh Kwag, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 602 days.

(21) Appl. No.: 17/278,114

(22) PCT Filed: Mar. 21, 2019

(86) PCT No.: PCT/KR2019/003329
§ 371 (c)(1),
(2) Date: Mar. 19, 2021

(87) PCT Pub. No.: WO2020/059989
PCT Pub. Date: Mar. 26, 2020

(65) Prior Publication Data
US 2021/0351171 A1 Nov. 11, 2021

(30) Foreign Application Priority Data
Sep. 21, 2018 (KR) .................... 10-2018-0114422

(51) Int. Cl.
*H01L 33/44* (2010.01)
*H01L 23/00* (2006.01)
(Continued)

(52) U.S. Cl.
CPC ............ *H01L 25/167* (2013.01); *H01L 24/95* (2013.01); *H01L 33/44* (2013.01); *H01L 33/54* (2013.01);
(Continued)

(58) Field of Classification Search
CPC ....... H01L 25/167; H01L 24/95; H01L 33/44; H01L 33/54; H01L 33/24;
(Continued)

(56) References Cited

U.S. PATENT DOCUMENTS 9,112,112 B2  8/2015  Do et al.
9,329,433 B2  5/2016  Negishi et al.
(Continued)

FOREIGN PATENT DOCUMENTS

KR    10-1244926    3/2013
KR    10-1436123    11/2014
(Continued)

OTHER PUBLICATIONS

International Search Report, with English translation, corresponding to International Application No. PCT/KR2019/003329 dated Jul. 3, 2019.
(Continued)

*Primary Examiner* — Suberr L Chi
(74) *Attorney, Agent, or Firm* — KILE PARK REED & HOUTTEMAN PLLC

(57) ABSTRACT

A display device may include: a substrate including a display area and a non-display area; and pixels disposed on the display area, and each including sub-pixels, each sub-pixel including a pixel circuit layer, and a display element layer including a light emitting element. The display element layer includes first and second electrodes spaced apart from each other; a first insulating layer disposed between the pixel circuit layer and the light emitting element; and a second
(Continued)

insulating layer disposed on the light emitting element and filling spaces between the first insulating layer and ends of the light emitting element. The light emitting element includes a first conductive semiconductor layer, an active layer enclosing at least one side of the first conductive semiconductor layer, a second conductive semiconductor layer enclosing the active layer, an electrode layer enclosing the second conductive semiconductor layer, and an insulating film covering the electrode layer.

23 Claims, 21 Drawing Sheets

(51) Int. Cl.
  *H01L 25/16* (2023.01)
  *H01L 33/54* (2010.01)
  *H01L 33/24* (2010.01)
(52) U.S. Cl.
  CPC .... *H01L 33/24* (2013.01); *H01L 2224/95102* (2013.01); *H01L 2224/95134* (2013.01); *H01L 2933/005* (2013.01)
(58) Field of Classification Search
  CPC . H01L 2224/95102; H01L 2224/95134; H01L 2933/005; H01L 2933/0066; H01L 33/18; H01L 33/385; H01L 27/1214; H01L 25/0753; H01L 29/78633; H01L 33/62; H01L 27/156; H01L 33/005; H01L 33/36; H01L 33/50
  See application file for complete search history.

(56) References Cited

U.S. PATENT DOCUMENTS

| | | | |
|---|---|---|---|
| 9,570,425 | B2 | 2/2017 | Do |
| 9,773,761 | B2 | 9/2017 | Do |
| 9,991,415 | B2 | 6/2018 | Teraguchi et al. |
| 10,249,603 | B2 | 4/2019 | Cho et al. |
| 10,340,419 | B2 | 7/2019 | Kim et al. |
| 10,367,123 | B2 | 7/2019 | Im et al. |
| 10,461,123 | B2 | 10/2019 | Kim et al. |
| 10,672,946 | B2 | 6/2020 | Cho et al. |
| 10,818,647 | B2 | 10/2020 | Kim et al. |
| 10,833,229 | B2 | 11/2020 | Choi et al. |
| 2003/0162463 | A1 | 8/2003 | Hayashi et al. |
| 2018/0012909 | A1* | 1/2018 | Kim .................. H01L 33/04 |
| 2018/0019369 | A1* | 1/2018 | Cho .................. H05K 1/181 |
| 2018/0175009 | A1* | 6/2018 | Kim .................. H01L 25/167 |
| 2018/0175106 | A1 | 6/2018 | Kim et al. |
| 2018/0287010 | A1 | 10/2018 | Sung |
| 2019/0019930 | A1 | 1/2019 | Do et al. |

FOREIGN PATENT DOCUMENTS

| | | |
|---|---|---|
| KR | 10-1490758 | 2/2015 |
| KR | 10-1674052 | 11/2016 |
| KR | 10-1711187 | 3/2017 |
| KR | 10-1713818 | 3/2017 |
| KR | 10-1730977 | 4/2017 |
| KR | 10-1742518 | 6/2017 |
| KR | 10-2018-0007025 | 1/2018 |
| KR | 10-2018-0007376 | 1/2018 |
| KR | 10-2018-0009014 | 1/2018 |
| KR | 10-2018-0055021 | 5/2018 |
| KR | 10-2018-0072909 | 7/2018 |
| KR | 10-1987196 | 6/2019 |
| KR | 10-2020-0001656 | 1/2020 |
| KR | 10-2020-0006208 | 1/2020 |
| KR | 10-2020-0031743 | 3/2020 |
| WO | 2018/004107 | 1/2018 |

OTHER PUBLICATIONS

Written Opinion, with English translation, corresponding to International Application No. PCT/KR2019/003329, dated Jul. 3, 2019.

* cited by examiner

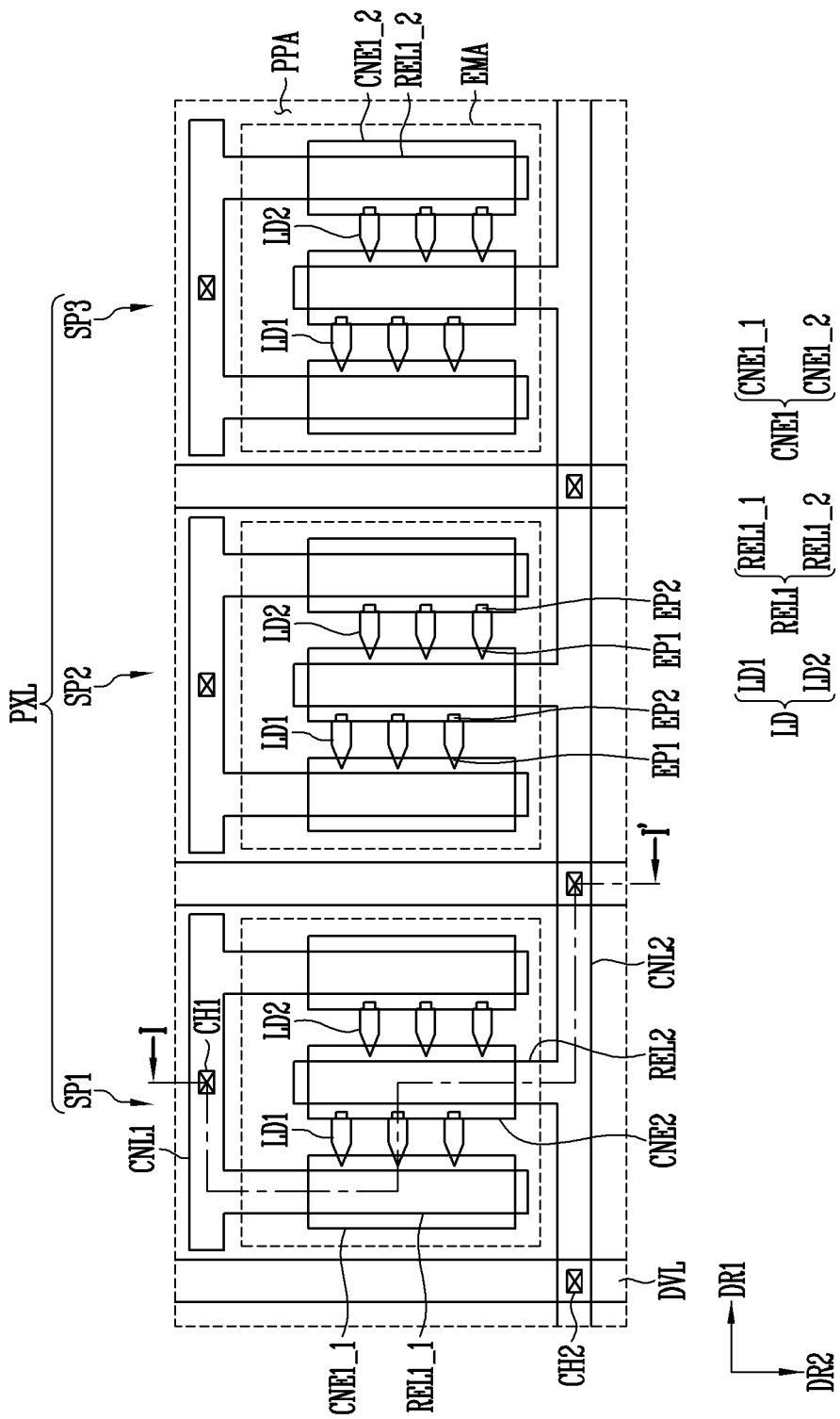

DISPLAY DEVICE AND METHOD FOR MANUFACTURING SAME

CROSS-REFERENCE TO RELATED APPLICATION(S)

This application is a national entry of International Application No. PCT/KR2019/003329, filed on Mar. 21, 2019, which claims under 35 U.S.C. §§ 119(a) and 365(b) priority to and benefits of Korean Patent Application No. 10-2018-0114422, filed on Sep. 21, 2018 in the Korean Intellectual Property Office (KIPO), the entire contents of which are incorporated herein by reference.

BACKGROUND

1. Technical Field

Various embodiments of the disclosure relate to a display device, and more specifically, to a display device including a subminiature light emitting element and a method of manufacturing the display device.

2. Description of the Related Art

A light emitting diode may have relatively satisfactory durability even under poor environmental conditions, and have excellent performances in terms of lifetime and luminance. Recently, research on the technology of applying such light emitting diodes to various display devices has become appreciably more active.

As a part of such research, technologies of fabricating a light emitting diode having a subminiature size corresponding to the micro-scale or the nano-scale using an inorganic crystalline structure, e.g., a structure obtained by growing a nitride-based semiconductor are being developed.

Light emitting diodes may be fabricated in a size small enough to form a pixel of a display device, etc. Light emitting diodes may be separately and independently grown on a substrate, and the grown light emitting diodes may be separated therefrom and used to manufacture a display panel. In the case where a light emitting diode is used as a light source of the display panel, light emitting diodes may be disposed in each pixel of the display panel. Here, if the light emitting diodes are disposed close to each other, an undesired short circuit may be caused between adjacent light emitting diodes, whereby the light emitting diodes may be damaged. As a result, a defect of a light emitting diode may occur.

SUMMARY

Various embodiments of the disclosure are directed to a display device capable of minimizing defects of light emitting elements.

Various embodiments of the disclosure are directed to a method of manufacturing the display device.

A display device in accordance with an embodiment of the disclosure may include: a substrate including a display area and a non-display area; and a plurality of pixels disposed on the display area, each of the plurality of pixels including a plurality of sub-pixels. Each of the plurality of sub-pixels may include a pixel circuit layer, and a display element layer including at least one light emitting element emitting light. The display element layer may further include: a first electrode and a second electrode spaced apart from each other; a first insulating layer disposed between the pixel circuit layer and the light emitting element; and a second insulating layer provided on the at least one light emitting element and filing spaces between the first insulating layer and opposite ends of the light emitting element with the second insulating layer. The light emitting element may include a first semiconductor layer (or a first conductive semiconductor layer), an active layer enclosing at least one side of the first conductive semiconductor layer, a second semiconductor layer (or a second conductive semiconductor layer) enclosing the active layer, an electrode layer enclosing the second conductive semiconductor layer, and an insulating film covering an outer circumferential surface of the electrode layer. A portion of the first conductive semiconductor layer and a portion of the electrode layer may not be covered by the insulating film.

In an embodiment of the disclosure, the first conductive semiconductor layer may include at least one n-type semiconductor layer, and the second conductive semiconductor layer may include at least one p-type semiconductor layer.

In an embodiment of the disclosure, the display element layer may include: a first contact electrode electrically connecting the first electrode with one of the ends of the at least one light emitting element; and a second contact electrode electrically connecting the second electrode with another one of the opposite ends of the at least one light emitting element.

In an embodiment of the disclosure, the first contact electrode may contact one of the portion of the electrode layer and the portion of the first conductive semiconductor layer. The second contact electrode may contact the other one of the portion of the electrode layer and the portion of the first conductive semiconductor layer.

In an embodiment of the disclosure, the first and the second contact electrodes may be disposed on a same layer, are spaced apart from each other on the second insulating layer, and are electrically insulated from each other.

In an embodiment of the disclosure, the second insulating layer may be formed of an organic insulating layer including an organic material.

In an embodiment of the disclosure, the display element layer may further include an additional insulating pattern disposed between the second insulating layer and the first and the second contact electrodes.

In an embodiment of the disclosure, the additional insulating pattern may include a material different from a material of the second insulating layer and a material of the insulating film.

In an embodiment of the disclosure, the display element layer may include a third insulating layer disposed on the first contact electrode, and a fourth insulating layer disposed on the second contact electrode. The first contact electrode and the second contact electrode may be disposed on different layers and electrically insulated from each other.

In an embodiment of the disclosure, the display element layer may include: a wall (or a partition wall) disposed between the pixel circuit layer and the first and the second electrodes; and a bank disposed on the pixel circuit layer, and between the plurality of sub-pixels and enclosing an emission area of each of the plurality of sub-pixels. The bank and the partition wall may be disposed on a same layer and include a same material.

In an embodiment of the disclosure, the display device may further include a color conversion layer disposed on the display element layer, the color conversion layer including color conversion particles converting the light to light having a specific color; and another substrate disposed on the color conversion layer.

In an embodiment of the disclosure, the first electrode and the second electrode may be electrically disconnected from each other, and one of the first and the second electrodes may have a shape enclosing the other one of the first and second electrodes.

In an embodiment of the disclosure, the at least one light emitting element may include a light emitting diode having a shape of a polyprism having a micro-scale or nano-scale size.

In an embodiment of the disclosure, the pixel circuit layer may include at least one transistor electrically connected to the at least one light emitting element.

The display device in accordance with the foregoing embodiments may be manufactured by a method including providing a base layer comprising a plurality of sub-pixels each including an emission area and a non-emission area; and forming, on the base layer, a display element layer emitting light from the emission area of each of the plurality of sub-pixels. The forming of the display element layer may include: forming a first electrode and a second electrode spaced apart from each other in the emission area of each of the plurality of sub-pixels; forming a first insulating layer exposing a portion of an upper surface each of the first and the second electrodes; aligning a plurality of light emitting elements between the first and the second electrodes by respectively applying corresponding alignment voltages to the first and the second electrodes; forming a second insulating layer exposing ends of each of the plurality of light emitting elements by depositing an insulating material layer on the light emitting elements and then etching the insulating material layer using a mask; exposing a portion of an electrode layer disposed on the ends of each of the plurality of light emitting elements and a portion of a first conductive semiconductor layer by using the second insulating layer as an etching mask to remove an insulating film disposed on the exposed ends of each of the plurality of light emitting elements; and forming a first contact electrode and a second contact electrode on the second insulating layer.

Each of the plurality of light emitting elements may include the first conductive semiconductor layer; an active layer enclosing at least one side of the first conductive semiconductor layer; a second conductive semiconductor layer enclosing the active layer; the electrode layer enclosing the second conductive semiconductor layer; and the insulating film covering an outer circumferential surface of the electrode layer, and the exposed portion of the electrode layer and the exposed portion of the first conductive semiconductor layer may not covered by the insulating film.

The first conductive semiconductor layer may include at least one n-type semiconductor layer, and the second conductive semiconductor layer may include at least one p-type semiconductor layer.

The first contact electrode may contact the first electrode and one of the exposed portion of the electrode layer and the exposed portion of the first conductive semiconductor layer, and the second contact electrode may contact the second electrode and the other one of the exposed portion of the electrode layer and the exposed portion of the first conductive semiconductor layer.

The forming of the second insulating layer may include disposing the second insulating layer on each of the plurality of light emitting elements and filling spaces between the first insulating layer and the ends of each of the plurality of light emitting elements with the second insulating layer.

The method may further include before the forming of the first and second electrodes, forming a partition wall in the emission area of each of the plurality of sub-pixels; and simultaneously forming, between the plurality of sub-pixels, a bank enclosing the emission area of each of the plurality of sub-pixels in the non-emission area of each of the plurality of sub-pixels. The partition wall and the bank may be disposed on a same layer.

Various embodiments of the disclosure may provide a display device capable of minimizing defects of light emitting elements, and a method of manufacturing the display device.

The effects of the disclosure are not limited by the foregoing, and other various effects are anticipated herein.

BRIEF DESCRIPTION OF THE DRAWINGS

FIG. 4 is a plan view schematically illustrating first to third sub-pixels included in one of the pixels illustrated in FIG. 2.

DETAILED DESCRIPTION OF THE EMBODIMENTS

Figure 1A:
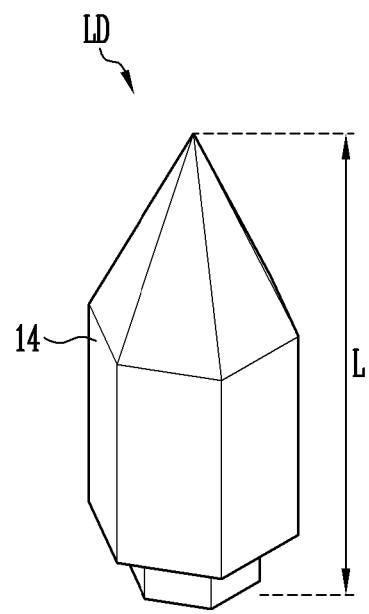
FIG. 1A is a perspective diagram schematically illustrating a light emitting element in accordance with an embodiment of the disclosure.

As the disclosure allows for various changes and numerous embodiments, some embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be directly on the second part or a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part, but a third part may intervene between them.

Embodiments and details of the disclosure are described with reference to the accompanying drawings in order to describe the disclosure in detail so that those having ordinary knowledge in the technical field to which the disclosure pertains can easily practice the disclosure. Furthermore, a singular form may include a plural form as long as it is not specifically mentioned in a sentence.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Figure 1B:
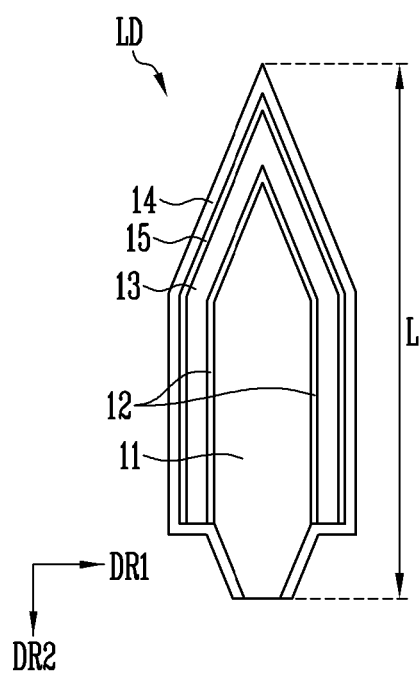
FIG. 1B is a schematic cross-sectional diagram illustrating the light emitting element of FIG. 1A.
Figure 1C:
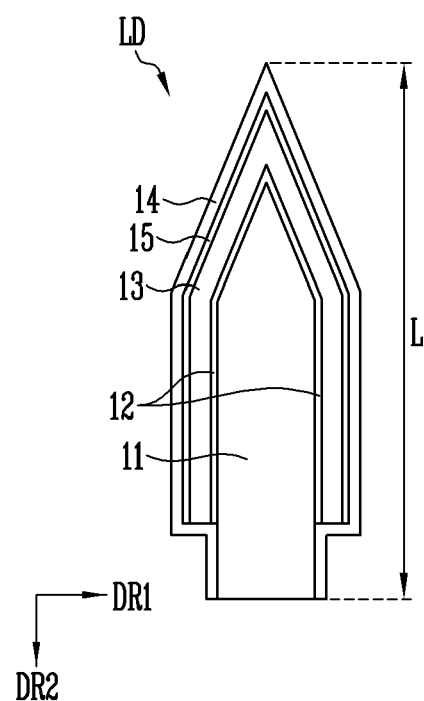
FIG. 1C is a schematic cross-sectional diagram illustrating a modified embodiment of the light emitting element of FIG. 1A.

FIG. 1A is a schematic perspective diagram schematically illustrating a light emitting element in accordance with an embodiment. FIG. 1B is a schematic cross-sectional diagram illustrating the light emitting element of FIG. 1A. FIG. 1C is a schematic cross-sectional diagram illustrating a modified embodiment of the light emitting element of FIG. 1A.

Referring to FIGS. 1A to 1C, a light emitting element LD in accordance with an embodiment may include a first conductive semiconductor layer 11, a second conductive semiconductor layer 13, and an active layer 12 interposed between the first and second conductive semiconductor layers 11 and 13. In some embodiments, the light emitting element LD may be implemented as a core-shell structure, including a first conductive semiconductor layer 11 disposed in a central area, an active layer 12 which encloses at least one side of the first conductive semiconductor layer 11, a second conductive semiconductor layer 13 which encloses at least one side of the active layer 12, and an electrode layer 15 which encloses at least one side of the second conductive semiconductor layer 13.

The light emitting element LD may be formed in a polypyramid shape extending in a direction. In an embodiment, the light emitting element LD may be provided in the form of a hexagonal pyramid. If the direction in which the light emitting element LD extends is defined as a longitudinal direction (L), the light emitting element LD may have a first end and a second end in the longitudinal direction (L). In an embodiment, one of the first and second conductive semiconductor layers 11 and 13 may be disposed on the first end of the light emitting element LD, and the other of the first and second conductive semiconductor layers 11 and 13 may be disposed on the second end of the light emitting element LD.

In an embodiment, the light emitting element LD may be manufactured in a polyprism shape, particularly, in a shape of a hexagonal prism, opposite ends of which protrude outward.

In an embodiment, the light emitting element LD may have a small size in a range of a nano-scale size or a micro-scale size, e.g., a diameter and/or a length L in a micro-scale or nano-scale range. However, in the disclosure, the size of the light emitting element LD is not limited thereto. For example, the size of the light emitting element LD may be changed in various ways depending on design conditions of various devices, e.g., a display device, which employs, as a light source, a light emitting device using a light emitting element LD.

The first conductive semiconductor layer 11 may include, for example, at least one n-type semiconductor layer. For instance, the first conductive semiconductor layer 11 may include an n-type semiconductor layer which includes a semiconductor material of InAlGaN, GaN, AlGaN, InGaN, AlN, and InN and is doped with a first conductive dopant such as Si, Ge, or Sn. However, the material forming the first conductive semiconductor layer 11 is not limited thereto, and the first conductive semiconductor layer 11 may be formed of various other materials.

In an embodiment, opposite ends of the first conductive semiconductor layer 11 may have shapes protruding in the longitudinal direction (L) of the light emitting element LD. The shapes in which the opposite ends of the first conductive semiconductor layer 11 protrude outward may differ from each other. For example, disposed at an upper position, a first end of the opposite ends of the first conductive semiconductor layer 11 may have a horn shape the width of which reduces upward to form an apex. Disposed at a lower position, a second end of the opposite ends of the first conductive semiconductor layer 11 may have a polygonal cross-section, the width of which reduces in width downward, as illustrated in FIG. 1B, or may have a square pillar shape having a constant width, as illustrated in FIG. 1C. The shapes of the opposite ends of the first conductive semiconductor layer 11 may be changed depending on embodiments rather than being limited to that of the foregoing embodiment.

In an embodiment, the first conductive semiconductor layer 11 may be disposed in a core, i.e., a central (or middle) portion, of the light emitting element LD. The light emitting element LD may have a shape corresponding to the shape of the first conductive semiconductor layer 11. For instance, in case that the first conductive semiconductor layer 11 has a hexagonal pyramid shape, the light emitting element LD may also have a hexagonal pyramid shape.

The active layer 12 may be provided and/or formed in a shape enclosing an outer circumferential surface of the first conductive semiconductor layer 11 in the longitudinal direction (L) of the light emitting element LD. In detail, the active layer 12 may be provided and/or formed in a shape enclosing an area of the first conductive semiconductor layer 11, other than the second end of the opposite ends of the first conductive semiconductor layer 11 that is disposed at the lower position with respect to the longitudinal direction (L) of the light emitting element LD.

The active layer 12 may have a single or multiple quantum well structure. In an embodiment, a cladding layer (not illustrated) doped with a conductive dopant may be formed on and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field having a predetermined voltage or more is applied to the opposite ends of the light emitting element LD, the light emitting element LD may emit light by recombination of electron-hole pairs in the active layer 12. Since light emission of the light emitting element LD can be controlled in accordance with the foregoing principle, the light emitting element LD may be used as a light source of various light emitting devices as well as a pixel of the display device.

The second conductive semiconductor layer 13 may be provided and/or formed in a shape enclosing the active layer 12 in the longitudinal direction (L) of the light emitting element LD, and may include a semiconductor layer having a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes any one semiconductor material of InAlGaN, GaN, AlGaN, InGaN, AlN, and InN, and is doped with a second conductive dopant such as Mg. However, the material forming the second conductive semiconductor layer 13 is not limited thereto, and the second conductive semiconductor layer 13 may be formed of various other materials.

In an embodiment, the light emitting element LD may include an electrode layer 15 that encloses at least one side of the second conductive semiconductor layer 13.

The electrode layer 15 may be an ohmic contact electrode electrically connected to the second conductive semiconductor layer 13, but the disclosure is not limited thereto. Furthermore, the electrode layer 15 may include metal or a metal oxide, and for example, Cr, Ti, Al, Au, Ni, ITO, IZO, ITZO, and an oxide or alloy thereof may be used alone or in combination. The electrode layer 15 may be substantially transparent or semitransparent. Therefore, light generated from the active layer 12 of the light emitting element LD may be emitted to the outside after passing through the electrode layer 15.

As described above, the light emitting element LD may have a hexagonal pyramid shape with the opposite ends protruding outward, and may be implemented as a core-shell structure including the first conductive semiconductor layer 11 provided in the central portion thereof, the active layer 12 which encloses the first conductive semiconductor layer 11, the second conductive semiconductor layer 13 which encloses the active layer 12, and the electrode layer 15 which encloses the second conductive semiconductor layer 13. The first conductive semiconductor layer 11 may be disposed on the first end of the light emitting element LD having a hexagonal pyramid shape, and the electrode layer 15 may be disposed on the second end of the light emitting element LD.

In an embodiment, the light emitting element LD may further include an insulating film 14 provided on the surface of the light emitting element LD. The insulating film 14 may include transparent insulating material. For example, the insulating film 14 may include at least one insulating material selected from the group consisting of $SiO_2$, $Si_3N_4$, $Al_2O_3$, and $TiO_2$, but the disclosure is not limited thereto. For example, various materials having insulating properties may be employed.

In an embodiment, the insulating film 14 may be provided to cover or overlap a portion of the outer circumferential surface of the first conductive semiconductor layer 11 and an outer circumferential surface of the electrode layer 15. In an embodiment, the insulating film 14 may be provided to cover the entirety of the outer circumferential surface of the electrode layer 15 included in the light emitting element LD.

The insulating film 14 may prevent the active layer 12 from short-circuiting due to electrically contacting a conductive material, except for the first conductive semiconductor layer 11 and the second conductive semiconductor layer 13. Thanks to the insulating film 14, occurrence of a defect on the surface of the light emitting element LD may be reduced or minimized, whereby the lifetime and efficiency of the light emitting element LD may be improved. In the case where light emitting elements LD are disposed close to each other, the insulating film 14 may prevent an undesired short-circuit from occurring between the light emitting elements LD.

In an embodiment, the insulating film 14 may expose at least one end of the opposite ends of the light emitting element LD that have different polarities. The insulating film 14 may expose a lower surface of the first conductive semiconductor layer 11 of the first and second conductive semiconductor layers 11 and 13 that are disposed on the opposite ends of the light emitting element LD in the longitudinal direction (L) of the light emitting element LD, rather than covering the lower surface.

The light emitting element LD may be employed as a light source for various display devices. The light emitting element LD may be fabricated through a surface treatment process.

Figure 2:
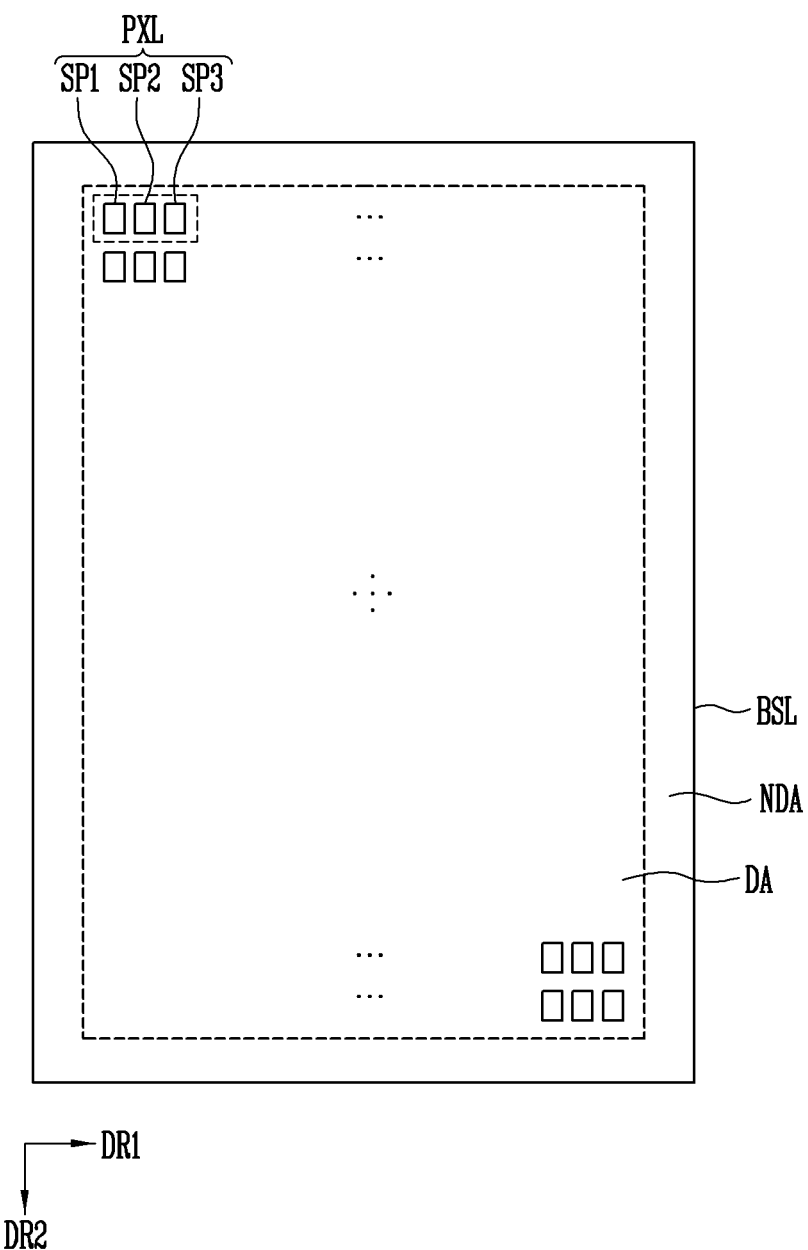
FIG. 2 illustrates a display device in accordance with an embodiment of the disclosure and is a schematic plan view illustrating a display device using the light emitting element illustrated in FIG. 1A as a light emitting source.

FIG. 2 illustrates a display device in accordance with an embodiment of the present disclosure, and particularly, is a schematic plan view illustrating a display device using the light emitting element illustrated in FIG. 1A as a light emitting source.

For the sake of explanation, FIG. 2 schematically illustrates the structure of the display device, focused on a display area in which an image is displayed. In some embodiments, although not illustrated, at least one driving circuit (e.g., a scan driver and a data driver) and/or lines may be further provided in the display device.

Referring to FIGS. 1A and 2, the display device in accordance with the embodiment may include a base layer BSL, pixels PXL provided on the base layer BSL and each including at least one light emitting element LD, a driver (not illustrated) provided on the base layer BSL and configured to drive the pixels PXL, and a line component (not illustrated) provided to couple or connect the pixels PXL with the driver.

The display device may be classified into a passive-matrix type display device and an active-matrix type display device according to a driving method. For example, in the case where the display device in an embodiment is implemented as an active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, contrast, and working speed thereof have been mainstreamed. However, the disclosure is not limited thereto. For example, passive-matrix type display devices in which pixels PXL may be turned on by groups may also employ components (e.g., first and second electrodes) for driving the light emitting element LD.

The base layer BSL may include a display area DA and a non-display area NDA.

In an embodiment, the display area DA may be disposed in a central portion of the display device, and the non-display area NDA may be disposed in a perimeter portion of the display device in such a way as to enclose the display area DA. The locations of the display area DA and the non-display area NDA are not limited thereto and may be changed.

The display area DA may be an area in which the pixels PXL for displaying an image are provided. The non-display area NDA may be an area in which the driver for driving the pixels PXL and a portion of the line unit for electrically connecting the pixels PXL to the driver are provided.

The display area DA may have various shapes. For example, the display area DA may be provided in various forms such as a closed polygon including sides formed of linear lines, a circle, an ellipse, or the like including a side formed of (or including) a curved line, and a semicircle, a semi-ellipse, or the like including sides formed of a linear line and a curved line.

The non-display area NDA may be provided on at least one side of the display area DA. In an embodiment, the non-display area NDA may enclose the display area DA.

The base layer BSL may be a rigid or flexible substrate, and the material or properties thereof are not particularly limited. For example, the base layer BSL may be a rigid substrate made of glass or reinforced glass, or a flexible substrate formed of a thin film made of plastic or metal. Furthermore, the base layer BSL may be a transparent substrate, but the disclosure is not limited thereto. For instance, the base layer BSL may be a translucent, opaque, or reflective substrate.

The pixels PXL may be disposed in the display area DA on the base layer BSL. Each of the pixels PXL refers to a smallest unit for displaying an image, and multiple of pixels PXL may be provided.

Each of the pixels PXL may include the light emitting element LD and be configured to be driven in response to a corresponding scan signal and a corresponding data signal. The light emitting element LD may have a small size in a range of a nano-scale to a micro-scale, and may be connected in parallel to light emitting elements LD disposed adjacent thereto. The light emitting element LD may form a light source of the corresponding pixel PXL.

Furthermore, each of the pixels PXL may include a sub-pixels. For example, each pixel PXL may include a first sub-pixel SP1, a second sub-pixel SP2, and a third sub-pixel SP3. In an embodiment, the first, second, and third sub-pixels SP1, SP2, and SP3 may emit light of different colors. For instance, the first sub-pixel SP1 may be a red sub-pixel for emitting red light, the second sub-pixel SP2 may be a green sub-pixel for emitting green light, and the third sub-pixel SP3 may be a blue sub-pixel for emitting blue light. However, the colors, types, and/or numbers of sub-pixels forming each pixel PXL are not particularly limited. For example, the color of light emitted from each sub-pixel may be changed in various ways. Although FIG. 2 illustrates an embodiment in which the pixels PXL are arranged in the display area DA in a stripe shape, the disclosure is not limited thereto. For instance, the display area DA may have various known pixel arrangement shapes.

The driver may provide a signal to each pixel PXL through the line component and control the operation of the pixel PXL. In FIG. 2, the line component is omitted for the sake of explanation.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 3A:
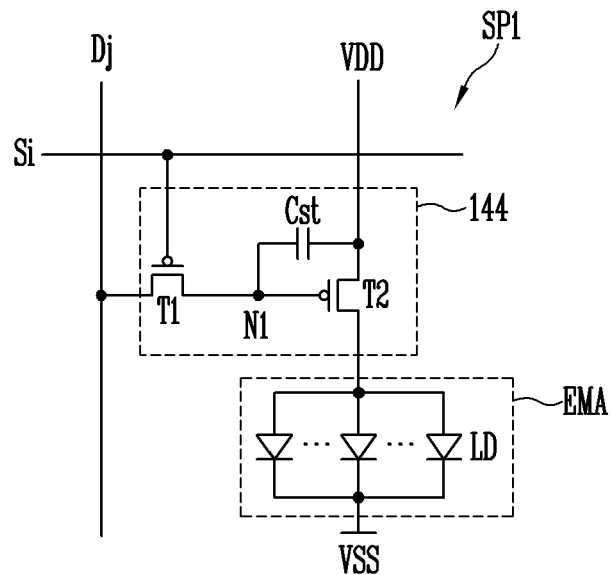
FIGS. 3A to 3C are schematic circuit diagrams illustrating examples of an emission area of the display device of FIG. 2 in accordance with various embodiments.
Figure 3B:
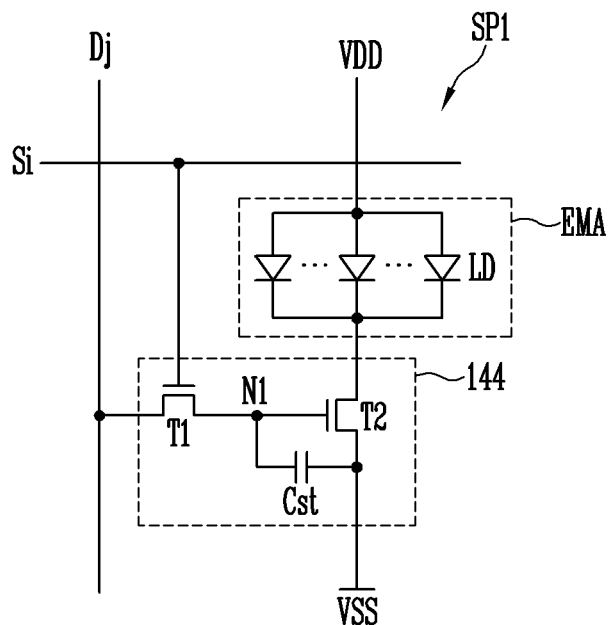
Figure 3C:
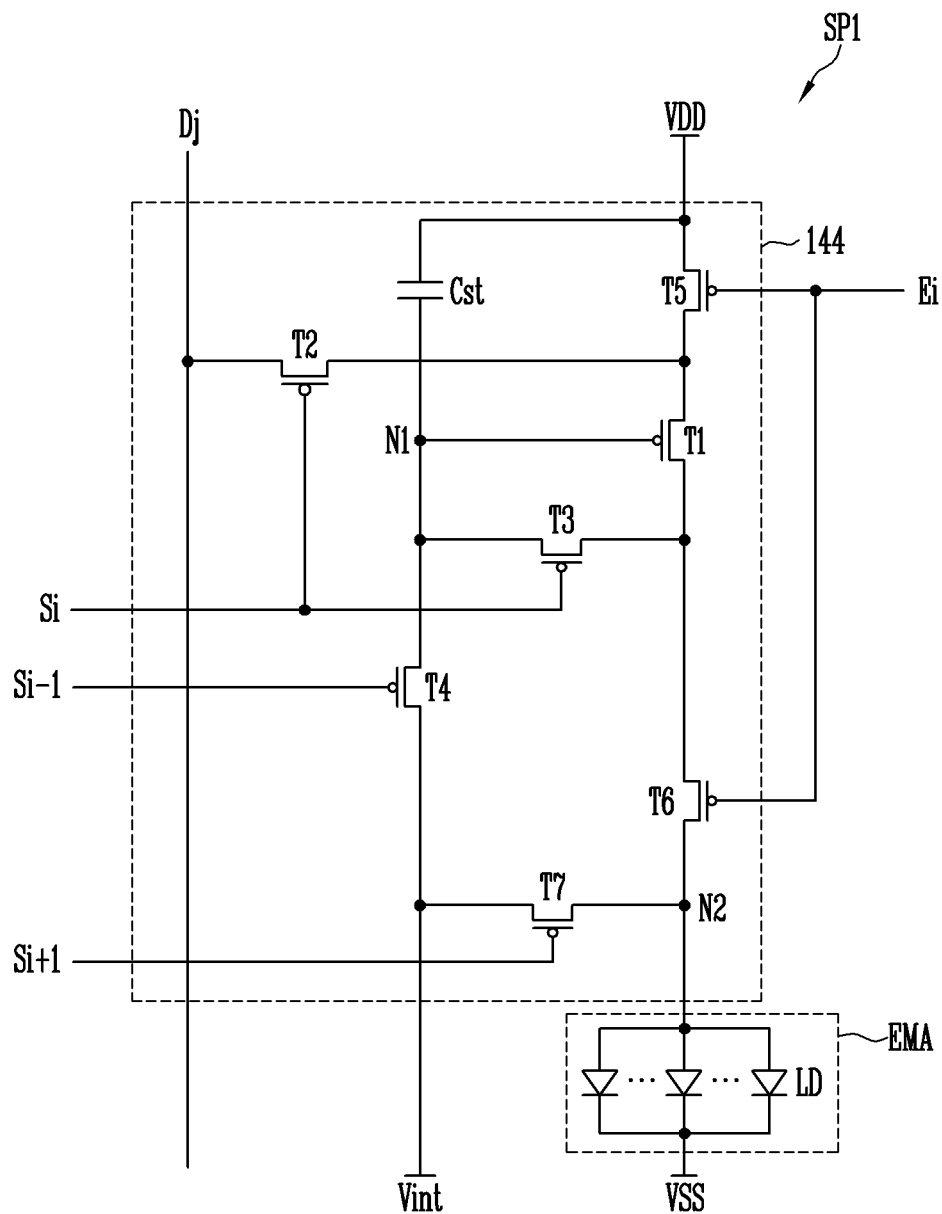

FIGS. 3A to 3C are schematic circuit diagrams illustrating an emission area of the display device of FIG. 2 in accordance with various embodiments. The emission area may be referred to as a unit emission area.

Referring to FIGS. 3A to 3C, each of the first to third sub-pixels SP1 to SP3 may be configured of an active pixel. However, the type, configuration, and/or driving method of each of the first to third sub-pixels SP1 to SP3 is not particularly limited. For example, each of the first to third sub-pixels may be configured of a pixel of a passive or active display device which can have various known structures.

Furthermore, referring to FIGS. 3A to 3C, the first to third sub-pixels SP1 to SP3 may have substantially the same structure or similar structures. Hereinafter, for the sake of convenience, the first sub-pixel SP1 of the first to third sub-pixels SP1 to SP3 will be described as an example.

Referring to FIGS. 1A, 2, and 3A, the first sub-pixel SP1 may include an emission unit EMA (or emission area) configured to generate light having a luminance corresponding to a data signal, and a pixel driving circuit 144 configured to drive the emission unit EMA.

In an embodiment, the emission unit EMA may include a plurality of light emitting elements LD connected in parallel to each other between a first driving power supply VDD and a second driving power supply VSS. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a voltage equal to or greater than a threshold voltage of the light emitting elements LD during an emission period of the first sub-pixel SP1. A first electrode (e.g., an anode electrode) of each of the light emitting elements LD may be electrically connected to the first driving power supply VDD via the pixel driving circuit 144. A second electrode (e.g., a cathode electrode) of each of the light emitting elements LD may be electrically connected to the second driving power supply VSS.

Each of the light emitting elements LD may emit light at a luminance corresponding to a driving current controlled by the pixel driving circuit 144.

Although FIGS. 3A to 3C illustrate embodiments in which the light emitting elements LD are connected in parallel to each other in the same direction (e.g., forward direction) between the first and second driving power supplies VDD and VSS, the disclosure is not limited thereto. For example, in an embodiment, some of the light emitting elements LD may be connected in the forward direction between the first and second driving power supplies VDD and VSS, and the other light emitting elements LD may be connected in a reverse direction. The voltage of one of the first and second driving power supplies VDD and VSS may be supplied in the form of an AC voltage. In this case, the light emitting elements LD connected in the forward direction and the light emitting elements LD connected in the reverse direction may alternately emit light. As another example, in an embodiment, the first sub-pixel SP1 may include only a single light emitting element LD.

In an embodiment, the pixel driving circuit 144 may include first and second transistors T1 and T2 and a storage capacitor Cst. The structure of the pixel driving circuit 144 is not limited to that of the embodiment illustrated in FIG. 3A.

A first electrode of the first transistor T1 (switching transistor) may be electrically connected to a data line Dj, and a second electrode thereof may be electrically connected to a first node N1. Here, the first electrode and the second electrode of the first transistor T1 may be different electrodes. For example, if the first electrode is a source electrode, the second electrode is a drain electrode. A gate electrode of the first transistor T1 may be electrically connected to the scan line Si.

In case that a scan signal having a voltage (e.g., a low-level voltage) capable of turning on the first transistor T1 is supplied from the scan line Si, the first transistor T1 may be turned on to electrically connect the data line Dj with the first node N1. Here, a data signal of a corresponding frame may be supplied to the data line Dj, and thus the data signal may be transmitted to the first node N1. The data signal transmitted to the first node N1 may be stored in the storage capacitor Cst.

A first electrode of the second transistor T2 (driving transistor) may be electrically connected to the first driving power supply VDD, and a second electrode thereof may be electrically connected to the first electrode of each of the light emitting elements LD. A gate electrode of the second transistor T2 is electrically connected to the first node N1. As such, the second transistor T2 may control the amount of driving current to be supplied to the light emitting elements LD in response to the voltage of the first node N1.

One electrode of the storage capacitor Cst may be electrically connected to the first driving power supply VDD, and the other electrode thereof may be electrically connected to the first node N1. The storage capacitor Cst may be charged with a voltage corresponding to a data signal supplied to the first node N1 and may maintain the charged voltage until a data signal of a subsequent frame is supplied thereto.

For the sake of explanation, FIG. 3A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the disclosure is not limited thereto, and the structure of the pixel driving circuit 144 may be changed in various ways. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting elements LD, or other circuit elements such as a boosting capacitor for boosting the voltage of the first node N1.

Furthermore, although FIG. 3A illustrates that the transistors, e.g., the first and second transistors T1 and T2, included in the pixel driving circuit 144 are P-type transistors, the disclosure is not limited thereto. For example, at least one of the first and second transistors T1 and T2 included in the pixel driving circuit 144 may be changed to an N-type transistor.

Referring to FIGS. 1A, 2, and 3B, the first and second transistors T1 and T2 in accordance with an embodiment may be N-type transistors. The configuration and operation of the pixel driving circuit 144 illustrated in FIG. 3B may be similar to those of the pixel driving circuit 144 of FIG. 3A except for connection positions of some components due to a change in the type of transistor. Therefore, detailed descriptions pertaining to this will be omitted.

In an embodiment, the configuration of the pixel driving circuit 144 is not limited to the embodiments illustrated in FIGS. 3A and 3B. For example, the pixel driving circuit 144 may be configured in the same manner as that of an embodiment illustrated in FIG. 3C.

Referring to FIGS. 1A, 2, and 3C, the pixel driving circuit 144 may be electrically connected to the scan line Si and the data line Dj of the first sub-pixel SP1. For example, in case that the first sub-pixel SP1 is disposed on an i-th row and a j-th column of the display area DA, the pixel driving circuit 144 of the first sub-pixel SP1 may be electrically connected to an i-th scan line Si and a j-th data line Dj of the display area DA.

In an embodiment, the pixel driving circuit 144 may also be electrically connected to at least one scan line. For example, the first sub-pixel SP1 disposed on the i-th row of the display area DA may be further electrically connected to an i−1-th scan line Si−1 and/or an i+1-th scan line Si+1.

In an embodiment, the pixel driving circuit 144 may be electrically connected not only to the first and second driving power supplies VDD and VSS but also to a third power supply. For example, the pixel driving circuit 144 may also be electrically connected to an initialization power supply Vint.

The pixel driving circuit 144 may include first to seventh transistors T1 to T7, and a storage capacitor Cst.

A first electrode of the first transistor T1 (driving transistor), e.g., a source electrode, may be electrically connected to the first driving power supply VDD via the fifth transistor T5, and a second electrode thereof, e.g., a drain electrode, may be electrically connected to an end of each light emitting elements LD via the sixth transistor T6. A gate electrode of the first transistor T1 may be electrically connected to a first node N1. The first transistor T1 may control driving current flowing between the first driving power supply VDD and the second driving power supply VSS via the light emitting elements LD in response to the voltage of the first node N1.

The second transistor T2(switching transistor) may be electrically connected between the j-th data line Dj electrically connected to the first sub-pixel SP1 and the source electrode of the first transistor T1. A gate electrode of the second transistor T2 may be electrically connected to the i-th can line Si electrically connected to the first sub-pixel SP1. In case that a scan signal having a gate-on voltage (e.g., a low-level voltage) is supplied from the i-th scan line Si, the second transistor T2 may be turned on to electrically connect the j-th data line Dj to the source electrode of the first transistor T1. Therefore, if the second transistor T2 is turned on, a data signal supplied from the j-th data line Dj may be transmitted to the first transistor T1.

The third transistor T3 may be electrically connected between the drain electrode of the first transistor T1 and the first node N1. A gate electrode of the third transistor T3 may be electrically connected to the i-th scan line Si. In case that a scan signal having a gate-on voltage is supplied from the i-th scan line Si, the third transistor T3 may be turned on to electrically connect the drain electrode of the first transistor T1 to the first node N1. Therefore, in case that the third transistor T3 is turned on, the first transistor T1 may be connected in the form of a diode (or diode-connected).

The fourth transistor T4 may be electrically connected between the first node N1 and an initialization power supply Vint. A gate electrode of the fourth transistor T4 may be electrically connected to a preceding scan line, e.g., an i−1th scan line Si−1. In case that a scan signal of a gate-on voltage is supplied to the i−1th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be electrically connected between the first driving power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei and may be turned on in other cases.

The sixth transistor T6 may be electrically connected between the first transistor T1 and a second node N2, which is electrically connected to first ends of the light emitting elements LD. A gate electrode of the sixth transistor T6 may be electrically connected to the i-th emission control line Ei. The sixth transistor T6 may be turned off in case that an emission control signal having a gate-off voltage is supplied to the i-th emission control line Ei, and may be turned on in other cases.

The seventh transistor T7 may be electrically connected between the second node N2, which is electrically connected to the first ends of the light emitting elements LD, and the initialization power supply Vint. A gate electrode of the seventh transistor T7 may be electrically connected to any one of scan lines of a subsequent stage, e.g., to the i+l-th scan line Si+1. In case that a scan signal of a gate-on voltage is supplied to the i+l-th scan line Si+1, the seventh transistor T7 may be turned on so that the voltage of the initialization power supply Vint may be supplied to the first ends of the light emitting elements LD.

The storage capacitor Cst may be electrically connected between the first driving power supply VDD and the first node N1. The storage capacitor Cst may store a voltage corresponding to the data signal applied to the first node N1 during each frame period and/or to the threshold voltage of the first transistor T1.

For the sake of convenience, FIG. 3C illustrates that all of the first to seventh transistors T1 to T7 are formed of P-type transistors, but the disclosure is not limited thereto. For example, at least one of the first to seventh transistors T1 to T7 included in the pixel driving circuit 144 may be an N-type transistor, or all of the first to seventh transistors T1 to T7 may be N-type transistors.

Figure 5:
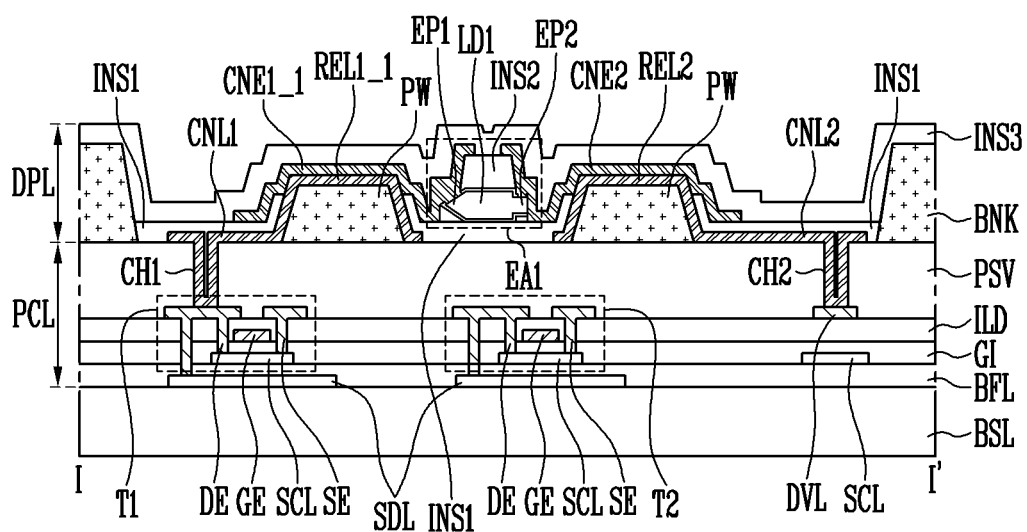
FIG. 5 is a schematic cross-sectional view taken along line I-I' of FIG. 4.
Figure 6A:
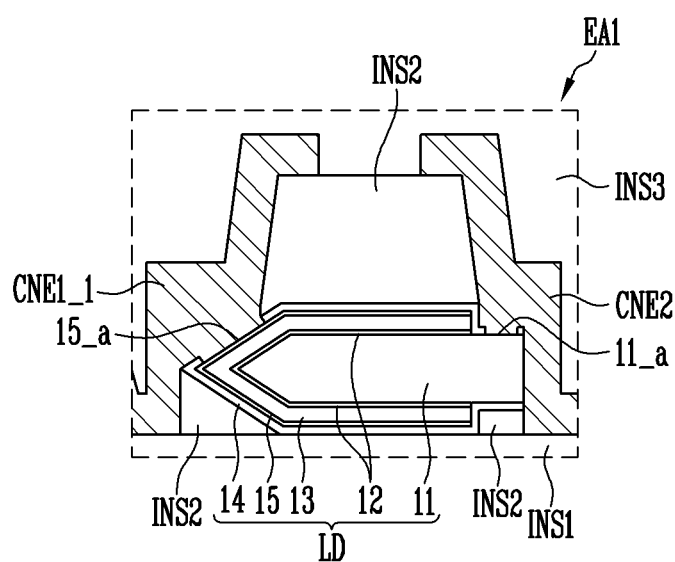
FIG. 6A is a schematic enlarged cross-sectional view of area EA1 of FIG. 5.
Figure 6B:
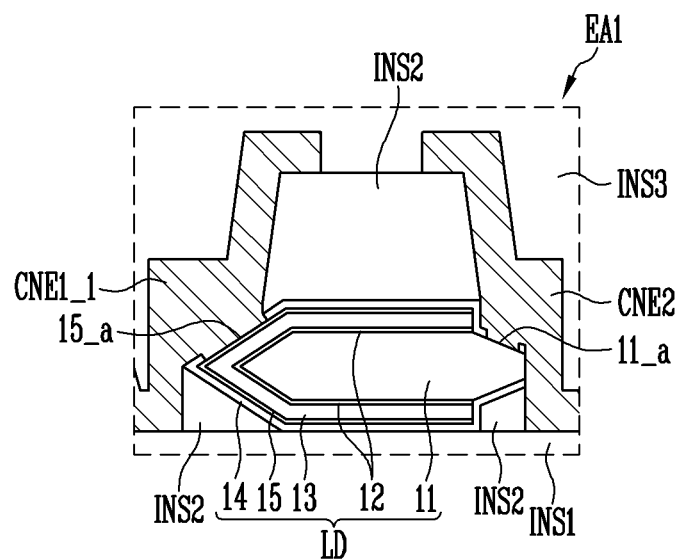
FIG. 6B is a schematic enlarged cross-sectional view illustrating a modified embodiment of the light emitting element of FIG. 6A.

FIG. 4 is a schematic plan view schematically illustrating first to third sub-pixels SP1 to SP3 included in one of the pixels PXL illustrated in FIG. 2. FIG. 5 is a schematic cross-sectional view taken along line I-I' of FIG. 4. FIG. 6A is a schematic enlarged cross-sectional view of area EA1 of FIG. 5. FIG. 6B is a schematic cross-enlarged sectional view illustrating a modified embodiment of the light emitting element of FIG. 6A.

In FIG. 4, for the sake of explanation, light emitting elements provided in each sub-pixel are illustrated as being horizontally aligned. However, the alignment of the light emitting elements is not limited thereto. For example, at least some of the light emitting elements may be aligned in a direction intersecting with the horizontal direction.

Furthermore, for the sake of explanation, illustration of transistors connected to the light emitting elements, and signal lines connected to the transistors has been omitted in FIG. 4.

Moreover, although FIGS. 4 to 6B illustrate a simplified structure of the pixel including an electrode having only a single electrode layer, the disclosure is not limited thereto.

Referring to FIGS. 1A, 2, and 4 to 6B, the display device in accordance with an embodiment may include a base layer BSL on which pixels PXL are provided.

Each of the pixels PXL may include a first sub-pixel SP1, a second sub-pixel SP2, and a third sub-pixel SP3 provided on the base layer BSL. In an embodiment, the first sub-pixel SP1 may be a red sub-pixel, the second sub-pixel SP2 may be a green sub-pixel, and the third sub-pixel SP3 may be a blue sub-pixel.

Each of the first to third sub-pixels SP1 to SP3 may include an emission area EMA through which light is emitted, and a non-emission area PPA disposed around a perimeter of the emission area EMA. In an embodiment, a pixel area of each of the first to third sub-pixels SP1 to SP3 may include an emission area EMA and a non-emission area PPA of the corresponding sub-pixel.

A base layer BSL, a pixel circuit layer PCL, and a display element layer DPL may be provided in the pixel area of each of the first to third sub-pixel SP1 to SP3.

The pixel circuit layer PCL of each of the first to third sub-pixels SP1 to SP3 may include a buffer layer BFL disposed on the base layer BSL, first and second transistors T1 and T2 disposed on the buffer layer BFL, and a driving voltage line DVL. The pixel circuit layer PCL of each of the first to third sub-pixels SP1 to SP3 may further include a passivation layer PSV provided on the first and second transistors T1 and T2 and the driving voltage line DVL.

The base layer BSL may include an insulating material such as glass, an organic polymer, or crystal. Furthermore, the base layer BSL may be made of a material having flexibility so as to be bendable or foldable, and may have a single or multilayer structure.

The buffer layer BFL may be provided on the base layer BSL and prevent impurities from diffusing into the first and second transistors T1 and T2. The buffer layer BFL may be omitted depending on the material of the base layer BSL or processing conditions.

A light shielding pattern SDL may be provided between the base layer BSL and the buffer layer BFL.

The light shielding pattern SDL may be a light shielding layer which is formed of conductive material, insulating material, or the like, and blocks light from being drawn to a rear surface of the base layer BSL so that the light can be blocked from being drawn to the pixel circuit layer PCL of each of the first to third sub-pixels SP1, SP2, and SP3. In an embodiment, the light shielding pattern SDL may include a black matrix. The light shielding pattern SDL may be provided on the base layer BSL to correspond to a lower portion of a semiconductor layer SCL of each of the first and second transistors T1 and T2. In an embodiment, the light shielding pattern SDL may be formed of metal, which is a conductive material. In this case, the light shielding pattern SDL may be electrically connected to a component of any one transistor (T1) of the first and second transistors T1 and T2.

The first transistor T1 may be a driving transistor electrically connected to some of the light emitting elements LD provided in the display element layer DPL of a corresponding sub-pixel to drive the light emitting elements LD. The second transistor T2 may be a switching transistor configured to switch the first transistor T1.

Each of the first and second transistors T1 and T2 may include a semiconductor layer SCL, a gate electrode GE, and source and drain electrodes SE and DE.

The semiconductor layer SCL may be disposed on the buffer layer BFL. The semiconductor layer SCL may include a source area which contacts the source electrode SE, and a drain area which contacts the drain electrode DE. An area between the source area and the drain area may be a channel area.

The semiconductor layer SCL may be a semiconductor pattern formed of polysilicon, amorphous silicon, an oxide semiconductor, or the like. The channel area may be an intrinsic semiconductor, which is an undoped semiconductor pattern. Each of the source area and the drain area may be a semiconductor pattern doped with an impurity.

The gate electrode GE may be provided on the semiconductor layer SCL with a gate insulating layer GI interposed therebetween.

The source electrode SE and the drain electrode DE may respectively contact the source area and the drain area of the semiconductor layer SCL through corresponding contact holes which pass through an interlayer insulating layer ILD and the gate insulating layer GI.

In an embodiment, each of the first and second transistors T1 and T2 included in the pixel circuit layer PCL provided in each sub-pixel may be formed of a low-temperature polycrystalline silicon (LTPS) thin-film transistor, but the disclosure is not limited thereto. In some embodiments, each of the first and second transistors T1 and T2 may be formed of an oxide semiconductor thin-film transistor.

The drain electrode DE of each of the first and second transistors T1 and T2 may be electrically connected with the light shielding pattern SDL provided on the base layer BSL. In detail, the drain electrode DE of each of the first and second transistors T1 and T2 may be electrically connected to a corresponding light shielding pattern SDL through a contact hole successively passing through the interlayer insulating layer ILD, the gate insulating layer GI, and the buffer layer BFL.

The driving voltage line DVL may be provided on the interlayer insulating layer ILD, but the disclosure is not limited thereto. In some embodiments, the driving voltage line DVL may be provided on one of the insulating layers included in the pixel circuit layer PCL. The voltage of the second driving power supply VSS of FIG. 3A may be applied to the driving voltage line DVL.

The passivation layer PSV may include a first contact hole CH1 which exposes a portion of the drain electrode DE of the first transistor T1, and a second contact hole CH2 which exposes a portion of the driving voltage line DVL.

The display element layer DPL of each of the first to third sub-pixels SP1 to SP3 may include a partition wall PW, first and second electrodes REL1 and REL2, first and second connection lines CNL1 and CNL2, light emitting elements LD, and first and second contact electrodes CNE1 and CNE2 provided on the passivation layer PSV.

The partition wall PW may be provided on the passivation layer PSV in the emission area EMA of each of the first to third sub-pixels SP1 to SP3. A bank BNK may be formed and/or provided in the non-emission area PPA between adjacent sub-pixels to define the emission area EMA of each sub-pixel SP1, SP2, or SP3. The bank BNK and the partition wall PW may be formed of a same material.

The partition wall PW may be disposed on the passivation layer PSV and spaced apart from a partition wall PW disposed adjacent thereto by a predetermined distance. Two adjacent partition walls PW may be disposed on the passivation layer PSV and spaced apart from each other by a length L of a light emitting element LD or greater. Although the partition wall PW may have a trapezoidal cross-section, the width of which reduces upward from a surface of the passivation layer PSV, as illustrated in FIG. 5, the disclosure is not limited thereto.

In an embodiment, the partition wall PW may include a cross-sectional shape having a curved surface such as a semicircular or semielliptical shape, the width of which is reduces upward from the surface of the passivation layer PSV. In a cross-sectional view, the shape of the partition walls PW is not limited to the foregoing examples, and may be changed in various ways as long as the efficiency of light emitted from each of the light emitting elements LD can be enhanced. The two adjacent partition walls PW may be disposed on the same plane on the passivation layer PSV and have the same height.

The first connection line CNL1 may extend from each of the first to third sub-pixels SP1 to SP3 in a first direction DR1. The first connection line CNL1 may be provided in only one corresponding sub-pixel so as to independently drive each of the first to third sub-pixels SP1 to SP3.

The second connection line CNL2 may extend in a direction parallel to a direction in which the first connection line CNL1 extends. The second connection line CNL2 may be provided in common to the first to third sub-pixels SP1 to SP3. Therefore, the first to third sub-pixels SP1 to SP3 may be connected in common to the second connection line CNL2.

Each of the first and second electrodes REL1 and REL2 may be provided in the emission area EMA of each of the first to third sub-pixels SP1 to SP3 and may extend in a second direction DR2 intersecting the first direction DR1. The first and second electrodes REL1 and REL2 may be provided on the same plane and spaced apart from each other by a predetermined distance.

The first electrode REL1 may include a 1-1-th electrode REL1_1 and a 1-2-th electrode REL1_2 which diverge in the second direction DR2 from the first connection line CNL1 extending in the first direction DR1. The 1-1-th electrode REL1_1, the 1-2-th electrode REL1_2, and the first connection line CNL1 may be integral with each other and be electrically and/or physically connected to each other.

The second electrode REL2 may extend in the second direction DR2 and be electrically connected with the second connection line CNL2. In an embodiment, the second electrode REL2 may diverge from the second connection line CNL2 in the second direction DR2. Therefore, the second electrode REL2 and the second connection line CNL2 may be integral with each other and be electrically and/or physically connected to each other.

Each of the first and second electrodes REL1 and REL2 may function as an alignment electrode for aligning the light emitting elements LD in the emission area EMA of each of the first to third sub-pixels SP1 to SP3.

Before the light emitting elements LD are aligned in the emission area EMA of each of the first to third sub-pixels SP1 to SP3, a first alignment voltage may be applied to the first electrode REL1 through the first connection line CNL1, and a second alignment voltage may be applied to the second electrode REL2 through the second connection line CNL2. The first alignment voltage and the second alignment voltage may have different voltage levels. As predetermined alignment voltages having different voltage levels are respectively applied to the first electrode REL1 and the second electrode REL2, an electric field may be formed between the first electrode REL1 and the second electrode REL2. Therefore, the light emitting elements LD may be aligned between the first electrode REL1 and the second electrode REL2.

In a plan view, the second electrode REL2 may be provided between the 1-1-th electrode REL1_1 and the 1-2-th electrode REL1_2 and spaced apart from each of the 1-1-th and 1-2-th electrodes REL1_1 and REL1_2 by a predetermined distance. The 1-1-th electrode REL1_1, the 1-2-th electrode REL1_2, and the second electrode REL2 may be alternately disposed on the passivation layer PSV.

After the light emitting elements LD are aligned in the emission area EMA of each of the first to third sub-pixels SP1 to SP3, each of the first and second electrodes REL1 and REL2 may function as a driving electrode for driving the light emitting elements LD.

The first and second electrodes REL1 and REL2 may be made of a material having a predetermined reflectivity to allow light emitted from the opposite ends EP1 and EP2 of each of the light emitting elements LD to travel in a direction (e.g., a frontal direction) in which an image of the display device is displayed.

In an embodiment, the first and second electrodes REL1 and REL2, the first connection line CNL1, and the second connection line CNL2 may be provided on the same layer and formed of the same material.

The first and second electrodes REL1 and REL2, the first connection line CNL1, and the second connection line CNL2 may be formed of a conductive material having a predetermined reflectivity. The conductive material may include metal such as Ag, Mg, Al, Pt, Pd, Au, Ni, Nd, Ir, Cr, Ti, or an alloy thereof, a conductive oxide such as an indium tin oxide (ITO), an indium zinc oxide (IZO), a zinc oxide (ZnO), or an indium tin zinc oxide (ITZO), and a conductive polymer such as PEDOT.

The materials of the first and second electrodes REL1 and REL2, the first connection line CNL1, and the second connection line CNL2 are not limited to the foregoing materials.

Each of the first and second electrodes REL1 and REL2, the first connection line CNL1, and the second connection line CNL2 may have a single layer structure, but the disclosure is not limited thereto. For example, it may have a multi-layer structure formed by stacking two or more materials of metals, alloys, conductive oxides, and conductive polymers.

Each of the first and second electrodes REL1 and REL2, the first connection line CNL1, and the second connection line CNL2 may have a multi-layer structure to reduce or minimize a voltage drop due to a signal delay in case that a signal is transmitted to the opposite ends EP1 and EP2 of each of the light emitting elements LD.

Since the first and second electrodes REL1 and REL2 have shapes corresponding to at least a portion of the shape of the partition wall PW, light emitted from the opposite ends EP1 and EP2 of each of the light emitting elements LD may be reflected by the first and second electrodes REL1 and REL2 and more effectively travel in the frontal direction of the display device. Therefore, the efficiency of light emitted from the light emitting elements LD may be enhanced.

In an embodiment, the partition wall PW and the first and second electrodes REL1 and REL2 may function as reflective components enabling light emitted from each of the light emitting elements LD to travel in the frontal direction of the display device, thus enhancing the light output efficiency of the light emitting elements LD.

One of the first and second electrodes REL1 and REL2 may be an anode electrode, and the other may be a cathode electrode. In an embodiment, the first electrode REL1 may be an anode electrode, and the second electrode REL2 may be a cathode electrode.

Each of the light emitting elements LD may be formed of a light emitting diode including a material having an inorganic crystal structure and having a subminiature size, e.g., a nano or micro-scale size.

Although at least two or tens of light emitting elements LD may be provided in the emission area EMA of each of the first to third sub-pixels SP1 to SP3, the disclosure is not limited thereto. In an embodiment, the number of light emitting elements LD provided in each sub-pixel SP1, SP2, or SP3 may be changed in various ways.

Each of the light emitting elements LD may include a first conductive semiconductor layer 11 disposed in a central portion of each light emitting element LD in the longitudinal direction (L), an active layer 12 which encloses at least one side of the first conductive semiconductor layer 11, and a second conductive semiconductor layer 13 which encloses the active layer 12. Furthermore, each of the light emitting elements LD may include an electrode layer 15 which encloses the second conductive semiconductor layer 13, and an insulating film 14 which encloses at least one side of the electrode layer 15.

Each of the light emitting elements LD may include a first end EP1 and a second end EP2 each of which has a shape protruding outward in the longitudinal direction (L). In an embodiment, the electrode layer 15 may be disposed on the first end EP1 of each light emitting element LD, and the first conductive semiconductor layer 11 may be disposed on the second end EP2 thereof. The first and second ends EP1 and EP2 may have different shapes protruding outward in the longitudinal direction (L) of each light emitting element LD. The first end EP1 may have a horn shape to form an apex in the longitudinal direction (L), and the second end EP2 may have a polyprism shape. For example, the second end EP2 of each light emitting element LD may have a square pillar shape having a constant width in the longitudinal direction (L) of the light emitting element LD, as illustrated in FIG. 6A. In an embodiment, as illustrated in FIG. 6B, the second end EP2 of each light emitting element LD may have a polyprism shape, the width of which is reduces from the left to the right in the longitudinal direction (L) of the light emitting element LD.

In an embodiment, each light emitting element LD may include an area 11_a of the first conductive semiconductor layer 11 and an area 15_a of the electrode layer 15 which are disposed on the opposite ends EP1 and EP2 of the light emitting element LD and are exposed to the outside.

Figure 9A:
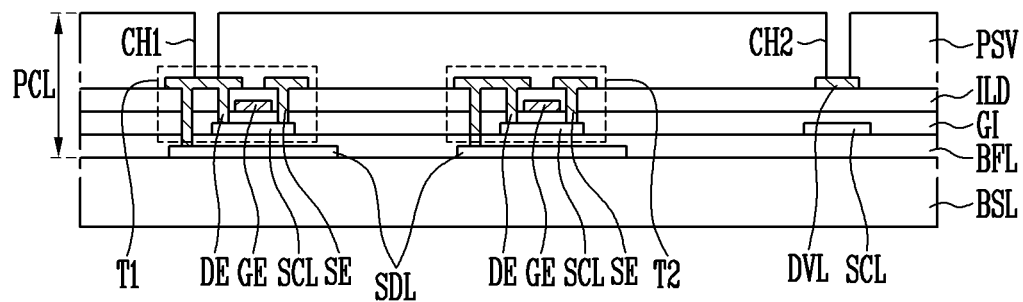
FIGS. 9A to 9J are schematic cross-sectional diagrams sequentially illustrating a method of manufacturing the display device of FIG. 5.
Figure 9B:
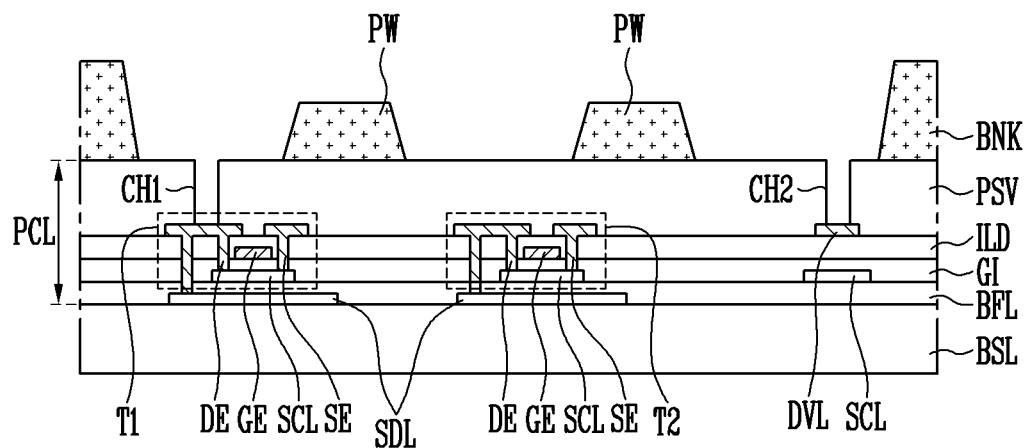
Figure 9C:
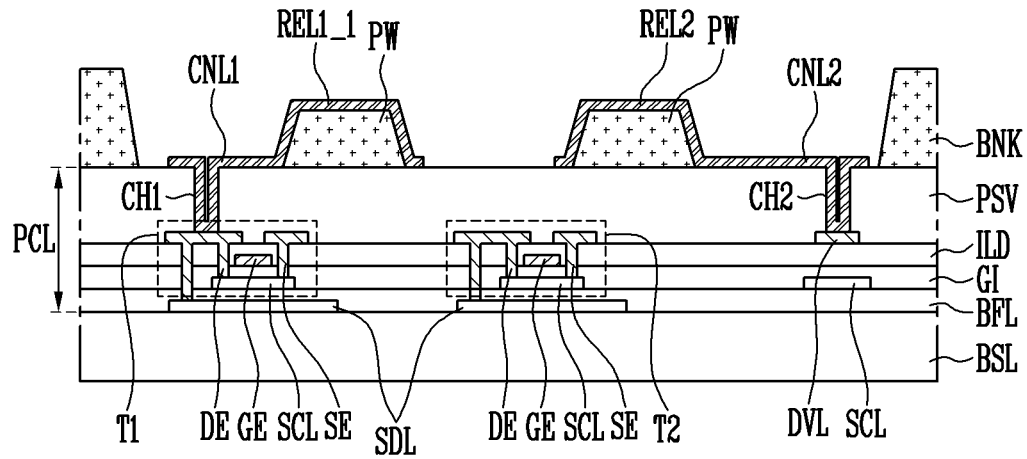
Figure 9D:
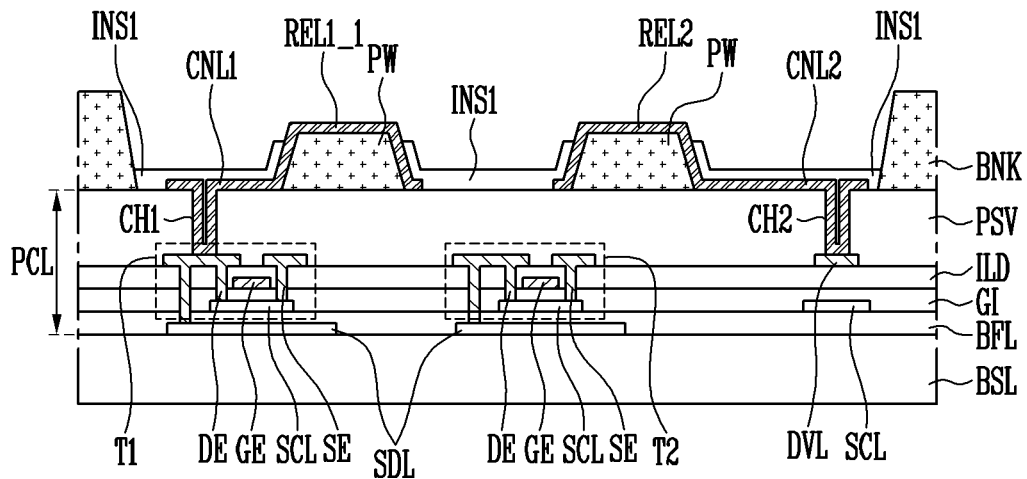
Figure 9E:
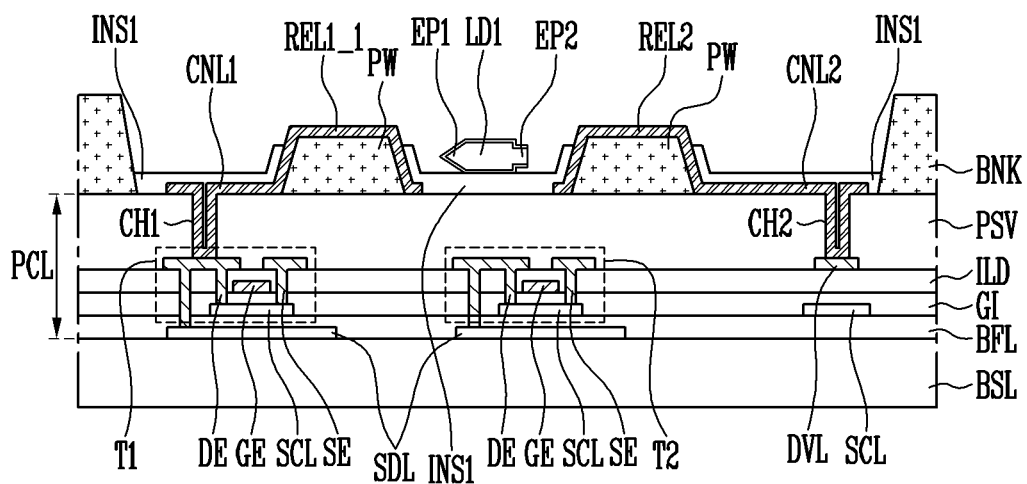
Figure 9F:
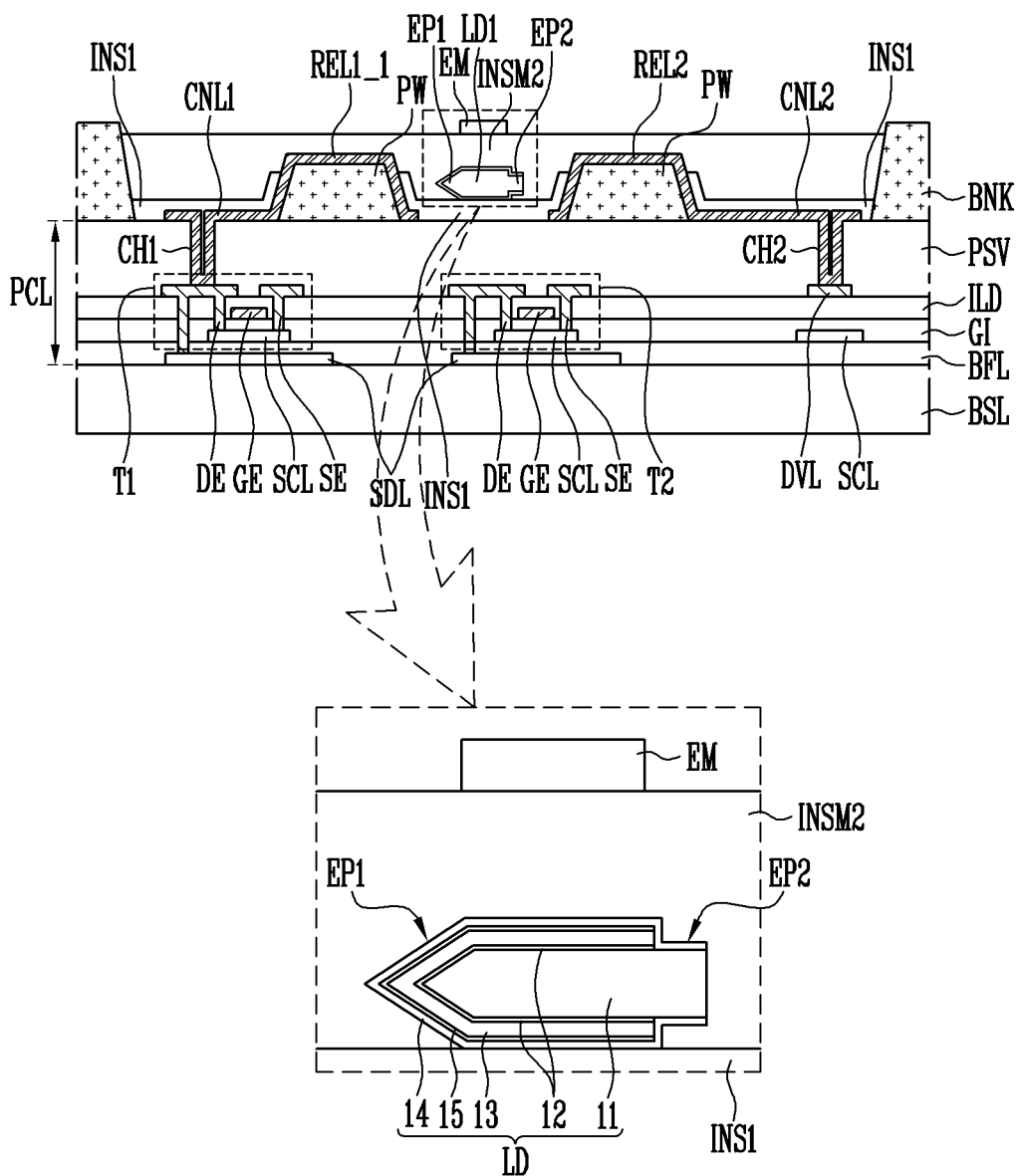
Figure 9G:
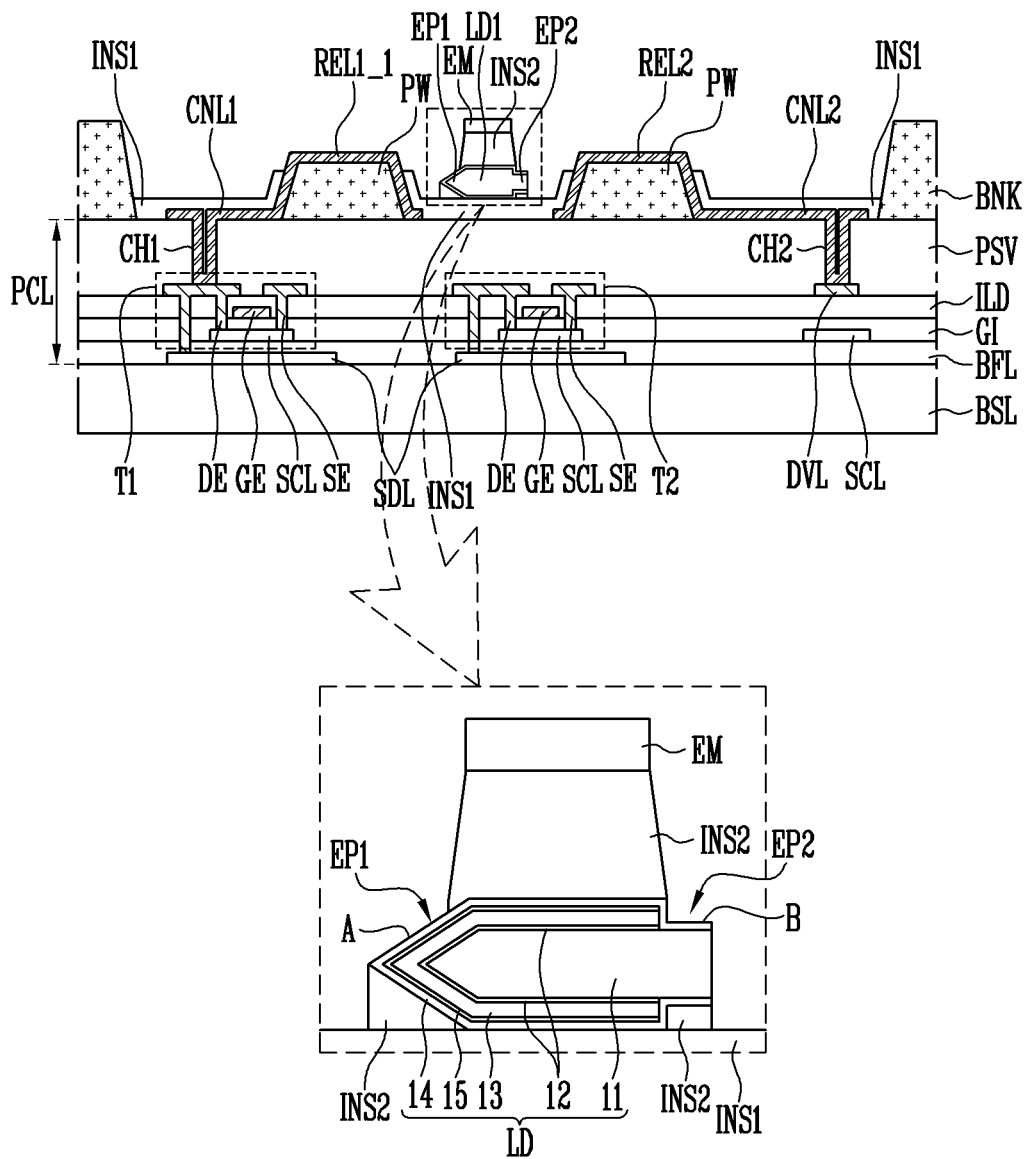
Figure 9H:
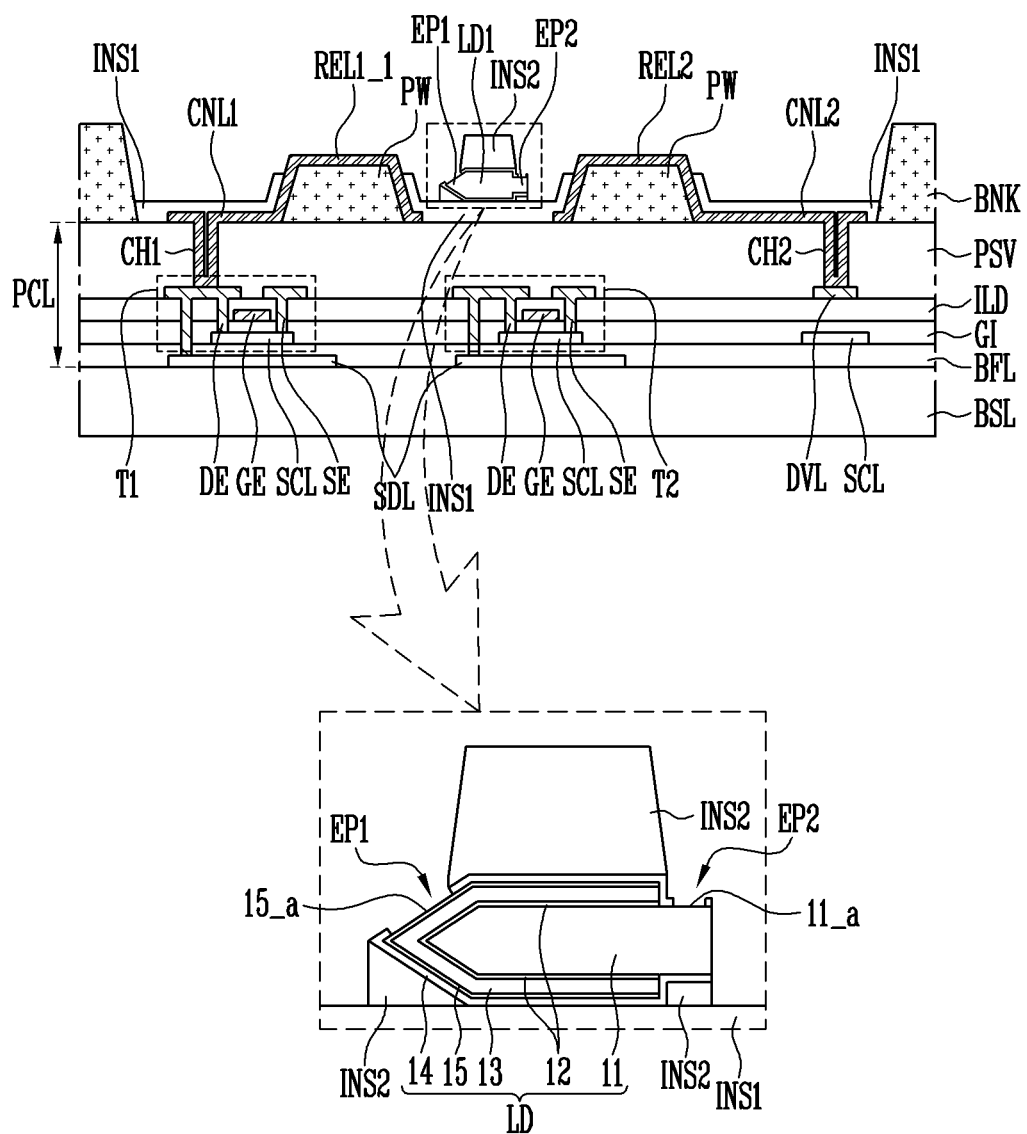
Figure 9I:
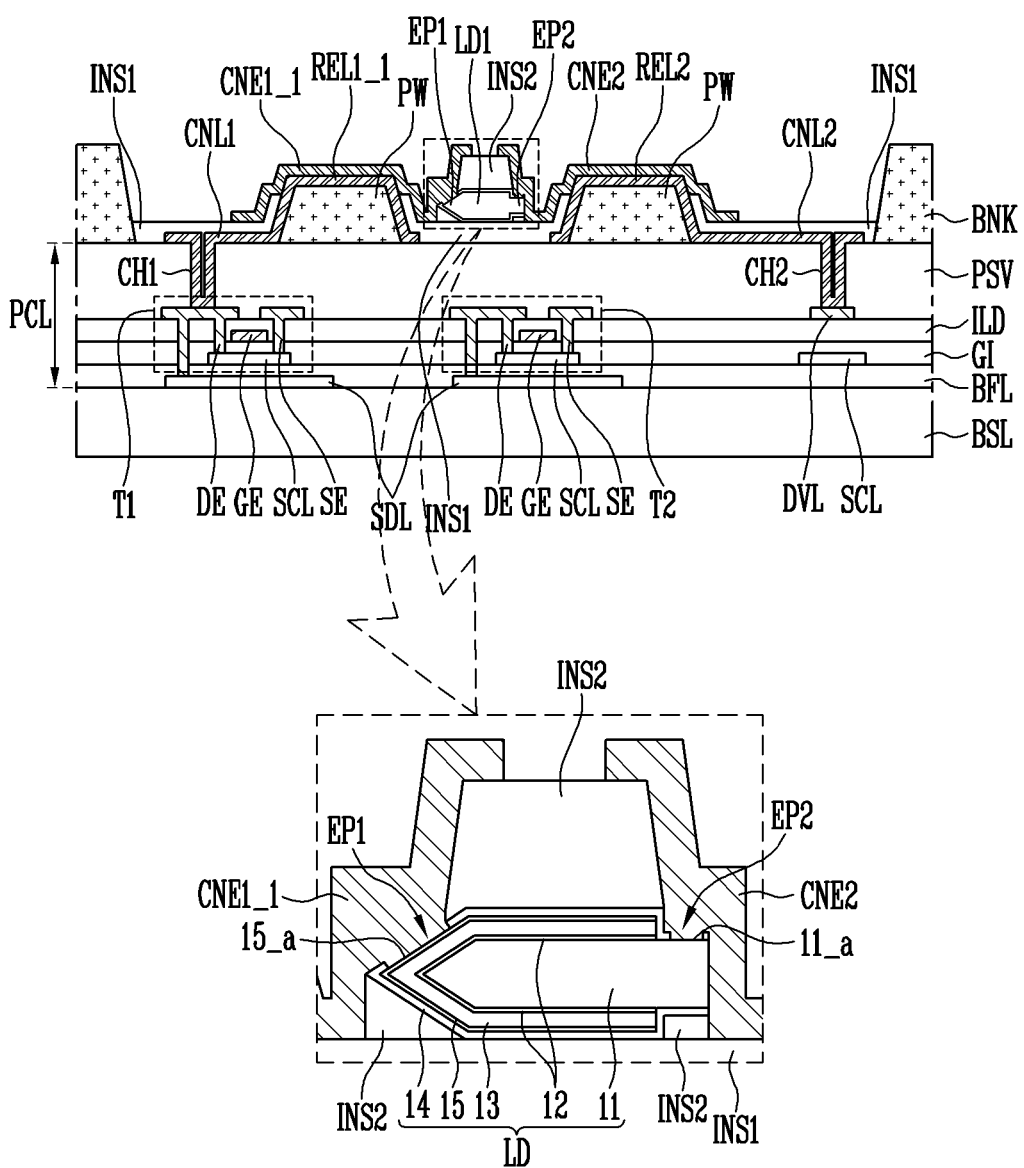
Figure 9J:
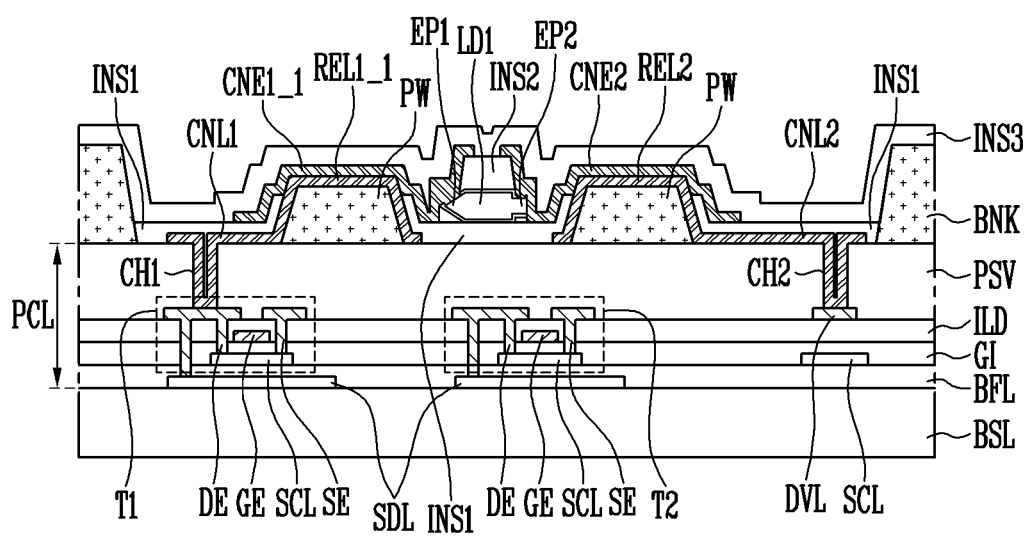

The insulating film 14 may not overlap or cover the area 15_a of the electrode layer 15 that is disposed on the first end EP1 of the light emitting element LD or the area 11_a of the first conductive semiconductor layer 11 that is disposed on the second end EP2 of the light emitting element LD. Therefore, the area 11_a of the first conductive semiconductor layer 11 and the area 15_a of the electrode layer 15 may be exposed to the outside. During a process of forming the display element layer DPL of each sub-pixel SP1, SP2, or SP3, the area 11_a of the first conductive semiconductor layer 11 and the area 15_a of the electrode layer 15 may be exposed to the outside by removing a portion of the insulating film 14. Detailed descriptions of this process will be made with reference to FIG. 9H.

In an embodiment, portions other than the area 11_a of the first conductive semiconductor layer 11, the lower surface of the first conductive semiconductor layer 11, and the area 15_a of the electrode layer 15 may be overlapped or covered by the insulating film 14.

In an embodiment, the light emitting elements LD may be divided into first light emitting elements LD1 aligned between the 1-1-th electrode REL1_1 and the second electrode REL2, and second light emitting elements LD2 aligned between the second electrode REL2 and the 1-2-th electrode REL1_2.

A second insulating layer INS2 overlapping a portion of an upper surface of each of the light emitting elements LD may be provided on the light emitting elements LD. A first insulating layer INS1 may be provided between each of the light emitting elements LD and the passivation layer PSV.

The first insulating layer INS1 may fill in space between the passivation layer PSV and each of the light emitting elements LD to stably support the light emitting elements LD and prevent the light emitting elements LD from being removed from the passivation layer PSV. The first insulating layer INS1 may be formed of an inorganic insulating layer including inorganic material, or an organic insulating layer including organic material.

The second insulating layer INS2 may be an organic insulating layer including organic material. In an embodiment, the second insulating layer INS2 may be disposed not only on a portion of the upper surface of each of the light emitting elements LD but also between the first insulating layer INS1 and the opposite ends EP1 and EP2 of each of the light emitting elements LD. For example, as illustrated in FIG. 5, a space between the first insulating layer INS1 and the first end EP1 of the first light emitting element LD1 and a space between the first insulating layer INS1 and the second end EP2 of the first light emitting element LD1 may be filled with the second insulating layer INS2.

In an embodiment, the first connection line CNL1 may be electrically connected to the drain electrode DE of the first transistor T1 through the first contact hole CH1 of the passivation layer PSV. The first connection line CNL1 may be integral with the first electrode REL1, and a signal of the first transistor T1 applied to the first connection line CNL1 may be transmitted to the first electrode REL1.

The first electrode REL1 may be disposed adjacent to one of the opposite ends EP1 and EP2 of each of the light emitting elements LD and may be electrically connected to each of the light emitting elements LD through the first contact electrode CNE1. Therefore, a signal of the first transistor T1 applied to the first electrode REL1 may be transmitted to each of the light emitting elements LD through the first contact electrode CNE1.

In an embodiment, the second connection line CNL2 may be electrically connected to the driving voltage line DVL through the second contact hole CH2 of the passivation layer PSV. The second connection line CNL2 may be integral with the second electrode REL2, and the voltage of the second driving power supply VSS of the driving voltage line DVL applied to the second connection line CNL2 may be transmitted to the second electrode REL2.

The second electrode REL2 may be disposed adjacent to the other of the opposite ends EP1 and EP2 of each of the light emitting elements LD and may be electrically connected to each of the light emitting elements LD through the second contact electrode CNE2. Therefore, the voltage of the second driving power supply VSS applied to the second electrode REL2 may be transmitted to each of the light emitting elements LD.

The first contact electrode CNE1 may be provided on the first electrode REL1 to electrically and/or physically and reliably connect the first electrode REL1 with one of the opposite ends EP1 and EP2 of each of the light emitting elements LD. The first contact electrode CNE1 may be formed of transparent conductive material to allow light emitted from each of the light emitting elements LD and reflected by the first electrode REL1 in the frontal direction of the display device to travel in the frontal direction without loss.

In a plan view, the first contact electrode CNE1 may cover or overlap the first electrode REL1. Furthermore, the first contact electrode CNE1 may partially overlap one of the opposite ends EP1 and EP2 of each of the light emitting elements LD. The first contact electrode CNE1 may include a 1-1-th contact electrode CNE1_1 provided on the 1-1-th electrode REL1_1, and a 1-2-th contact electrode CNE1_2 provided on the 1-2-th electrode REL1_2.

In an embodiment, the 1-1-th contact electrode CNE1-1 may directly contact the electrode layer 15 disposed on the first end EP1 of the first light emitting element LD1, as illustrated in FIGS. 5 and 6A. In other words, the 1-1-th contact electrode CNE1-1 may directly contact the area 15_a of the electrode layer 15 that is exposed to the outside rather than being overlapped by the insulating film 14 in the first light emitting element LD1.

The second contact electrode CNE2 may be provided on the second electrode REL2. In a plan view, the second contact electrode CNE2 may overlap the second electrode REL2. Furthermore, the second contact electrode CNE2 may overlap the second end EP2 of each of the first light emitting elements LD1 and the first end EP1 of each of the second light emitting elements LD2. The second contact electrode CNE2 and the first contact electrode CNE1 may include a same material, but the disclosure is not limited thereto.

In an embodiment, the second contact electrode CNE2 may directly contact the first conductive semiconductor layer 11 disposed on the second end EP2 of the first light emitting element LD1, as illustrated in FIGS. 5 and 6A. In other words, the second contact electrode CNE2 may directly contact the area 11_a of the first conductive semiconductor layer 11 that is exposed to the outside rather than being overlapped by the insulating film 14 in the first light emitting element LD1.

In an embodiment, the first contact electrode CNE1 and the second contact electrode CNE2 may be provided on the same plane (or layer) and spaced apart from each other by a predetermined distance on the second insulating layer INS2 so that the first and second contact electrodes CNE1 and CNE2 can be electrically disconnected and/or physically separated from each other. In other words, the first contact electrode CNE1 and the second contact electrode CNE2 may be provided on the same layer and formed by the same manufacturing process. In some embodiments, the first contact electrode CNE1 and the second contact electrode CNE2 may be provided on different layers.

A third insulating layer INS3 overlapping the first and second contact electrodes CNE1 and CNE2 may be provided on the first and second contact electrodes CNE1 and CNE2. The third insulating layer INS3 may prevent the first and second contact electrodes CNE1 and CNE2 from being exposed to the outside, thereby preventing the first and second contact electrodes CNE1 and CNE2 from being corroding.

The third insulating layer INS3 may be formed of an inorganic insulating layer including inorganic material, or an organic insulating layer including organic material. Although the third insulating layer INS3 may have a single layer structure as shown in the drawings, the disclosure is not limited thereto. For example, the third insulating layer INS3 may have a multi-layer structure. In the case where the third insulating layer INS3 has a multi-layer structure, the third insulating layer INS3 may have a structure formed by alternately stacking inorganic insulating layers and organic insulating layers. For example, the third insulating layer INS3 may have a structure formed by sequentially stacking a first inorganic insulating layer, an organic insulating layer, and a second inorganic insulating layer.

An overcoat layer (not illustrated) may be provided on the third insulating layer INS3. The overcoat layer may be a planarization layer for mitigating a step difference (or height difference) formed by the partition wall PW, the first and second electrodes REL1 and REL2, the first and second contact electrodes CNE1 and CNE2, or the like that are disposed under the overcoat layer. The overcoat layer may be an encapsulating layer preventing oxygen, water, or the like from penetrating into the light emitting elements LD.

Predetermined voltages may be respectively applied to the opposite ends EP1 and EP2 of each of the light emitting elements LD through the first electrode REL1 and the second electrode REL2. Thereof, each of the light emitting elements LD may emit light by recombination of electron-hole pairs in the active layer 12 of each of the light emitting elements LD. Here, the active layer 12 may emit light having a wavelength in a range of about 400 nm to about 900 nm.

As described above, in an embodiment, portions of the opposite ends EP1 and EP2 of each of the light emitting elements LD may be exposed to the outside. In detail, the area 15_a of the electrode layer 15 disposed on the first end EP1 of each light emitting element LD, the area 11_a of the first conductive semiconductor layer 11 disposed on the second end EP2 of each light emitting element LD, and the lower surface of the first conductive semiconductor layer 11 may not be overlapped by the insulating film 14, so that the area 15_a of the electrode layer 15 and the area 11_a of the first conductive semiconductor layer 11 may be exposed to the outside.

In case that the area 11_a of the first conductive semiconductor layer 11 of each of the light emitting elements LD and the lower surface thereof, and the area 15_a of the electrode layer 15 are exposed to the outside, an exposed surface area of the first conductive semiconductor layer 11 and an exposed surface area of the electrode layer 15 may be increased. If the exposed surface area of the first conductive semiconductor layer 11 is increased, a valid contact surface area between the first conductive semiconductor layer 11 of each light emitting element LD and the second contact electrode CNE2 may be further increased. Furthermore, if the respective exposed surfaces of the electrode layers 15 of the light emitting elements LD are increased, a valid contact surface area between the first contact electrode CNE1 and the second conductive semiconductor layer 13 that forms an ohmic contact with the electrode layer 15 of each light emitting element LD may be further increased.

The increase in the valid contact surface area of each light emitting element LD may reduce or minimize contact defects of the corresponding light emitting element LD and reduce contact resistance of the first and second conductive semiconductor layers 11 and 13. Therefore, the characteristics of each light emitting element LD may be enhanced, so that the output efficiency of light emitted from each light emitting element LD can be enhanced.

Figure 7:
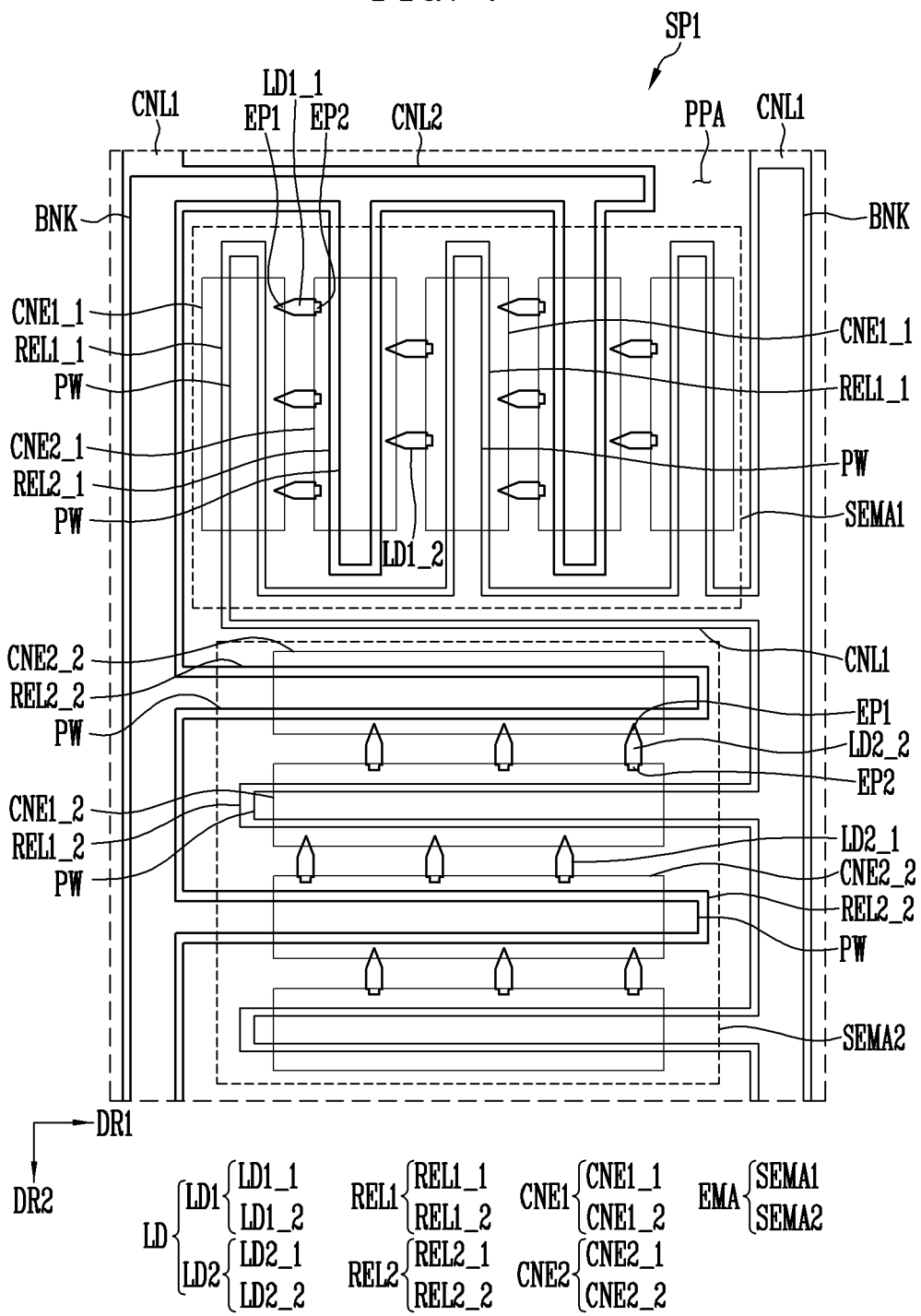
FIG. 7 is a schematic plan view illustrating another embodiment of the first sub-pixel in the pixel of FIG. 4.

FIG. 7 is a schematic plan view illustrating another embodiment of the first sub-pixel in the pixel of FIG. 4.

The configuration of the first sub-pixel SP1 illustrated in FIG. 7 may be substantially identical or similar to that of the first SP1 sub-pixel of FIG. 4 except for a structure in which an emission area EMA includes first and second sub-emission areas SEMA1 and SEMA2 and the alignments of first and second electrodes REL1 and REL2 are different from each other in the respective first and second sub-emission areas SEMA1 and SEMA2.

Therefore, to avoid redundant explanation, the description of the first sub-pixel SP1 of FIG. 7 will be focused on differences from that of the foregoing embodiments. Components which are not separately explained in the following description of this embodiment may comply with those of the foregoing embodiments. The same reference numeral will be used to denote the same component, and a similar reference numeral will be used to denote a similar component.

Referring to FIGS. 1A, 4, and 7, the first sub-pixel SP1 may include an emission area EMA which may emit light, and a non-emission area PPA disposed around the emission area EMA.

A display element layer (refer to the display element layer DPL of FIG. 5) of the first sub-pixel SP1 may include a partition wall PW, first and second electrodes REL1 and REL2, first and second connection lines CNL1 and CNL2, light emitting elements LD, and first and second contact electrodes CNE1 and CNE2 provided on a circuit element layer (refer to the pixel circuit layer PCL of FIG. 5).

The light emitting elements LD may include first light emitting elements LD1 and second light emitting elements LD2. The first light emitting elements LD1 each may include first and second ends EP1 and EP2 in a first direction DR1. Here, the first direction DR1 may refer to a horizontal direction in a plan view. The second light emitting elements LD2 each may include first and second ends EP1 and EP2 in a second direction DR2 intersecting the first direction DR1. Here, the second direction DR2 may refer to a vertical direction in a plan view. The first light emitting elements LD1 may be aligned in the horizontal direction, and the second light emitting elements LD2 may be aligned in the vertical direction.

Each of the first and second light emitting elements LD1 and LD2 may have a hexagonal pyramid shape, as illustrated in FIG. 1A. For example, each of the first and second light emitting elements LD1 and LD2 may include first and second ends EP1 and EP2 protruding outward in the longitudinal direction (L). The first conductive semiconductor layer 11 may be disposed on one of the first and second ends EP1 and EP2 of each of the first and second light emitting elements LD1 and LD2. The electrode layer 15 may be disposed on the other of the first and second ends EP1 and EP2 of each of the first and second light emitting elements LD1 and LD2.

In an embodiment, the emission area EMA of the first sub-pixel SP1 may include a first sub-emission area SEMA1 in which the first light emitting elements LD1 are provided, and a second sub-emission area SEMA2 on which the second light emitting elements LD2 are provided.

In an embodiment, the first electrode REL1 may include a 1-1-th electrode REL1_1 and a 1-2-th electrode REL1_2, and the second electrode REL2 may include a 2-1-th electrode REL2_1 and a 2-2-th electrode REL2_2. The first light emitting elements LD1 may include 1-1-th light emitting elements LD1_1 disposed between the 1-1-th electrode REL1_1 and the 2-1-th electrode REL2_1, and 1-2-th light emitting elements LD1_2 disposed between the 2-1-th electrode REL2_1 and the 1-1-th electrode REL1_1. The second light emitting element LD2 may include 2-1-th light emitting elements LD2_1 disposed between the 1-2-th electrode REL1_2 and the 2-2-th electrode REL2_2, and 2-2-th light emitting elements LD2_2 disposed between the 2-2-th electrode REL2_2 and the 1-2-th electrode REL1_2.

In a plan view, a portion of the first electrode REL1 and a portion of the second electrode REL2 may be alternately provided in the first direction DR1 in the first sub-emission area SEMA1. For example, the 1-1-th electrode REL1_1 of the first electrode REL1 and the 2-1-th electrode REL2_1 of the second electrode REL2 may be alternately provided in the first direction DR1 in the first sub-emission area SEMA1.

In a plan view, another portion of the first electrode REL1 and another portion of the second electrode REL2 may be alternately provided in the second direction DR2 in the second sub-emission area SEMA2. For example, the 1-2-th electrode REL1_2 of the first electrode REL1 and the 2-2-th electrode REL2_2 of the second electrode REL2 may be alternately provided in the second direction DR2 in the second sub-emission area SEMA2.

In an embodiment, the first contact electrode CNE1 may include a 1-1-th contact electrode CNE1_1 provided on the 1-1-th electrode REL1_1 and overlapping the 1-1-th electrode REL1_1 in a plan view, and a 1-2-th contact electrode CNE1_2 provided on the 1-2-th electrode REL1_2 and overlapping with the 1-2-th electrode REL1_2 in a plan view.

Furthermore, the second contact electrode CNE2 may include a 2-1-th contact electrode CNE2_1 provided on the 2-1-th electrode REL2_1 and overlapping the 2-1-th electrode REL2_1 in a plan view, and a 2-2-th contact electrode CNE2_2 provided on the 2-2-th electrode REL2_2 and overlapping the 2-2-th electrode REL2_2 in a plan view.

A distance between the 1-1-th and 2-1-th electrodes REL1_1 and REL2_1 in the first sub-emission area SEMA1 and a distance between the 1-2-th and 2-2-th reflective electrodes REL1_2 and REL2_2 in the second sub-emission area SEMA2 may be designed to be the same as each other. The reason for this is because an alignment surface area of the first light emitting elements LD1 aligned in the first sub-emission area SEMA1 and alignment surface area of the second light emitting elements LD2 aligned in the second sub-emission area SEMA2 can be the same. In the case where the respective alignment surface areas of the first and second sub-emission areas SEMA1 and SEMA2 are the same as each other, the first and second light emitting elements LD1 and LD2 may be prevented from being biased to an area. The 1-1-th and 2-1-th electrodes REL1_1 and REL2_1 may be reflective electrodes.

A bank BNK and a partition wall PW and be disposed on the same plane, and the bank BNK may be provided in the non-emission area PPA of the first sub-pixel SP1. The bank BNK may be formed and/or provided in the non-emission area PPA between the first sub-pixel SP1 and sub-pixels adjacent to the first sub-pixel SP1 to define the emission area EMA of each sub-pixel SP1, SP2, or SP3.

In an embodiment, the partition wall PW and the bank BNK may be formed of organic insulating material including organic material, but the disclosure is not limited thereto. In an embodiment, the partition wall PW and the bank BNK may be formed of an inorganic insulating material including an inorganic material or a conductive material which may not directly affect the first and second electrodes REL1 and REL2 and the light emitting elements LD.

For the sake of explanation, there is illustrated an example where the bank BNK provided in the non-emission area PPA of the first sub-pixel SP1 is integral with the partition wall PW provided in each of the first and second sub-emission areas SEMA1 and SEMA2. However, the disclosure is not limited thereto. In an embodiment, the bank BNK may be provided in the non-emission area PPA of the first sub-pixel SP1 such that the bank BNK is spaced apart from the partition wall PW by a predetermined distance on the same plane.

In the non-emission area PPA of the first sub-pixel SP1, the first and second connection lines CNL1 and CNL2 may be provided on a corresponding bank BNK and thus may overlap the corresponding bank BNK in a plan view.

Figure 8:
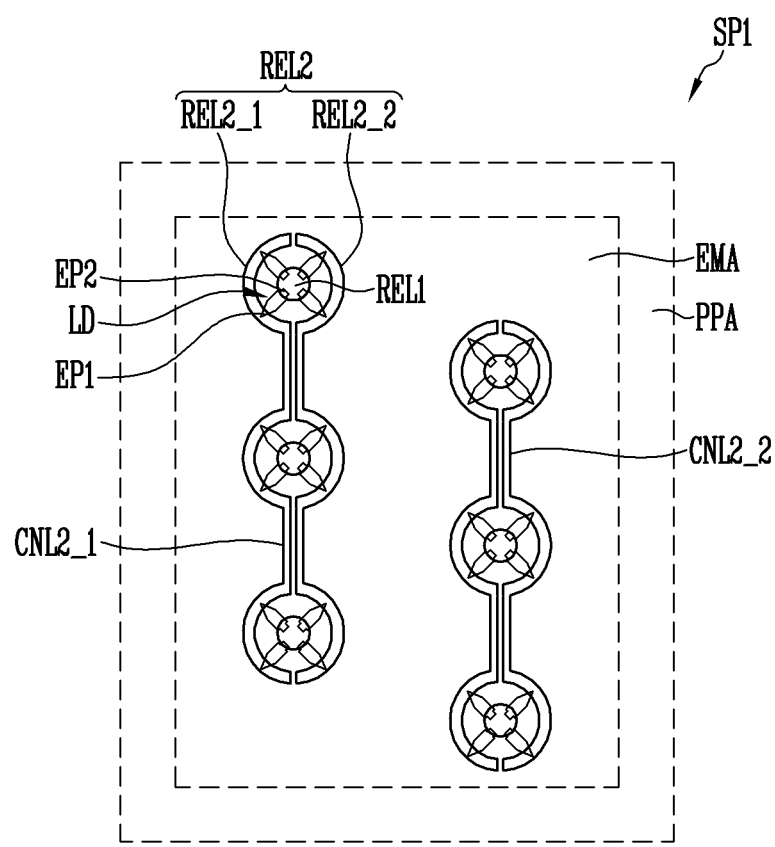
FIG. 8 is a schematic plan view illustrating another embodiment of the first sub-pixel in the pixel of FIG. 4.

FIG. 8 is a schematic plan view illustrating another embodiment of the first sub-pixel in the pixel of FIG. 4.

To avoid redundant explanation, the description of the first sub-pixel SP1 of FIG. 8 will be focused on differences from that of the foregoing embodiments. Components which are not separately explained in the following description of the embodiment may comply with that of the foregoing embodiments. The same reference numeral will be used to denote the same component, and a similar reference numeral will be used to denote a similar component.

For the convenience of illustration, FIG. 8 illustrates only first and second electrodes REL1 and REL2, light emitting elements LD provided between the first and second electrodes REL1 and REL2, and a second connection line CNL2 electrically connected to the second electrode.

Referring to FIGS. 1A, 4, and 8, the first sub-pixel SP1 may include an emission area EMA for emitting light, and a non-emission area PPA disposed around the emission area EMA.

A display element layer (refer to the display element layer DPL of FIG. 5) of the first sub-pixel SP1 may include the first and second electrodes REL1 and REL2, the second connection line CNL2, and light emitting elements LD provided on a circuit element layer (refer to the pixel circuit layer PCL of FIG. 5).

In an embodiment, the first and second electrodes REL1 and REL2 may be provided on the same plane on the passivation layer PSV and be electrically connected with the light emitting elements LD. Each of the first and second electrodes REL1 and REL2 may have a circular shape. In this case, if the first and second electrodes REL1 and REL2 are respectively supplied with corresponding alignment voltages, an electric field having a radial shape may be formed between the first and second electrodes REL1 and REL2. Therefore, the light emitting elements LD may be aligned in various directions along the circumference of the first electrode REL1.

As illustrated in FIG. 1A, each of the light emitting elements LD may have a polypyramid shape. For example, each of the light emitting elements LD may include first and second ends EP1 and EP2 protruding outward in the longitudinal direction (L). The first conductive semiconductor layer 11 may be disposed on one of the first and second ends EP1 and EP2 of each of the light emitting elements LD. The electrode layer 15 may be disposed on the other of the first and second ends EP1 and EP2 of each of the light emitting elements LD.

Although as shown in the drawings each of the first and second electrodes REL1 and REL2 may have a circular shape, but the disclosure is not limited thereto, and each of the first and second electrodes REL1 and REL2 may have various shapes such as an elliptical shape, a rectangular shape, and a polygonal shape.

The first electrode REL1 and the second electrode REL2 may be provided in the emission area EMA of the first sub-pixel SP1. The second electrode REL2 may be provided in a shape enclosing the perimeter of the first electrode REL1 For example, the second electrode REL2 may extend in a circumferential direction around the first electrode REL1 In an embodiment, the second electrode REL2 may include a 2-1-th electrode REL2-1 and a 2-2-th electrode REL2_2. The 2-1-th electrode REL2 _1 and the 2-2-th electrode REL2_2 may be spaced apart from each other by a predetermined distance.

The 2-1-th electrode REL2 _1 may be electrically connected to a 2-1-th electrode REL2_1 disposed in the same column in the second direction DR2 through the 2-1-th connection line CNL2_1. The 2-2-th electrode REL2_2 may be electrically connected to a 2-2-th electrode REL2_2 disposed in the same column in the second direction DR2 through the 2-2-th connection line CNL2_2.

FIGS. 9A to 9J are schematic cross-sectional diagrams sequentially illustrating a method of manufacturing the display device of FIG. 5.

Referring to FIGS. 1A to 9A, the pixel circuit layer PCL may be formed on the respective base layers BSL of the first to third sub-pixels SP1, SP2, and SP3. The pixel circuit layer PCL may include the light shielding pattern SDL, the first and second transistors T1 and T2, the driving voltage line DVL, and the passivation layer PSV.

The passivation layer PSV may include the first contact hole CH1 which exposes the drain electrode DE of the first transistor T1, and the second contact hole CH2 which exposes the driving voltage line DVL.

Referring to FIGS. 1A to 9B, after an insulating material layer (not illustrated) is applied to the passivation layer PSV, the partition wall PW may be formed in the emission area EMA of each of the first to third sub-pixels SP1, SP2, and SP3 by patterning the insulating material layer using a mask (not illustrated), and simultaneously, the bank BNK may be formed in the non-emission area PPA between the first to third sub-pixels SP1, SP2, and SP3.

In an embodiment, the partition wall PW and the bank BNK may be provided on the same surface and include the same material. For example, the partition wall PW and the bank BNK each may be an organic insulating layer including organic material.

Referring to FIGS. 1A to 9C, the first and second electrodes REL1 and REL2 and the first and second connection lines CNL1 and CNL2 that include conductive material having a high reflectivity may be formed on the passivation layer PSV of each sub-pixel SP1, SP2, or SP3 including the partition wall PW.

Each of the first and second electrodes REL1 and REL2 may be provided and/or formed on a corresponding partition wall PW in the emission area EMA of each sub-pixel SP1, SP2, or SP3. Each of the first and second connection lines CNL1 and CNL2 may be provided and/or formed in the non-emission area PPA of each sub-pixel SP1, SP2, or SP3.

In an embodiment, the first connection line CNL1 may be electrically connected to the first transistor T1 of the pixel circuit layer PCL through the first contact hole CH1 of the passivation layer PSV. The first connection line CNL1 may be integral with the first electrode REL1 and electrically and/or physically connected to the first electrode REL1. Therefore, a signal (or voltage) applied to the first transistor T1 may be transmitted to the first electrode REL1 through the first connection line CNL1.

The second connection line CNL2 may be electrically connected to the driving voltage line DVL of the pixel circuit layer PCL through the second contact hole CH2 of the passivation layer PSV. The second connection line CNL2 may be integral with the second electrode REL2 and electrically and/or physically connected to the second electrode REL2. Therefore, the voltage of the second driving power supply VSS of the driving voltage line DVL may be transmitted to the second electrode REL2 through the second connection line CNL2.

Referring to FIGS. 1A to 9D, after an insulating material layer (not illustrated) is deposited on the passivation layer PSV on which the first and second electrodes REL1 and REL2 are formed, the first insulating layer INS1 may be formed by patterning the insulating material layer using a mask (not illustrated).

The first insulating layer INS1 may be formed and/or provided in the emission area EMA of each sub-pixel SP1, SP2, and SP3 between the first electrode REL1 and the second electrode REL2 and may be formed and/or provided on the first and second connection lines CNL1 and CNL2 in the non-emission area PPA of each sub-pixel SP1, SP2, and SP3.

Referring to FIGS. 1A to 9E, an electric field may be formed between the first electrode REL1 and the second electrode REL2 by respectively applying corresponding alignment voltages to the first and second electrodes REL1 and REL2 of each sub-pixel through the first and second connection lines CNL1 and CNL2. In the case where direct current power or alternating current power having a predetermined voltage and a period is repeatedly applied several times to each of the first and second electrodes REL1 and REL2 through the first and second connection lines CNL1 and CNL2, an electric field may be formed between the first and second electrodes REL1 and REL2 by a difference in potential between the first and second electrodes REL1 and REL2.

In a state in which an electric field is formed between the first electrode REL1 and the second electrode REL2 formed in the emission area EMA of each sub-pixel SP1, SP2, or SP3, light emitting elements LD may be supplied by an inkjet printing method or the like. For example, the light emitting elements LD may be supplied onto the passivation layer PSV of the emission area EMA of each sub-pixel SP1, SP2, or SP3 by disposing a nozzle over the passivation layer PSV and dropping a solvent including the light emitting elements LD onto the passivation layer PSV through the nozzle. The solvent may be one of acetone, water, alcohol, and toluene, but the disclosure is not limited thereto. For example, the solvent may include a material which may be vaporized at the room temperature or by heat. Furthermore, the solvent may have the form of ink or paste. A method of supplying the light emitting elements LD is not limited to the foregoing method. The method of supplying the light emitting elements LD may be changed. Subsequently, the solvent may be removed.

If the light emitting elements LD are supplied to the passivation layer PSV, self-alignment of the light emitting elements LD may be induced by the electric field formed between the first electrode REL1 and the second electrode REL2. Therefore, the light emitting elements LD may be aligned between the first electrode REL1 and the second electrode REL2. In other words, the light emitting elements LD may be intensively aligned in a target area, e.g., the emission area EMA of each sub-pixel SP1, SP2, or SP3.

In an embodiment, the light emitting elements LD each may be aligned on the first insulating layer INS1 between the first electrode REL1 and the second electrode REL2. Each of the light emitting elements LD may include a first conductive semiconductor layer 11 disposed in a central portion of each light emitting element LD in the longitudinal direction (L), an active layer 12 which encloses at least one side of the first conductive semiconductor layer 11, and a second conductive semiconductor layer 13 which encloses the active layer 12. Furthermore, each of the light emitting elements LD may include an electrode layer 15 which encloses the second conductive semiconductor layer 13, and an insulating film 14 which encloses the electrode layer 15 and may be implemented as a core-shell structure.

Each of the light emitting elements LD may include a first end EP1 and a second end EP2 each of which has a shape protruding outward in the longitudinal direction (L). The electrode layer 15 may be disposed on the first end EP1 of each light emitting element LD, and the first conductive semiconductor layer 11 may be disposed on the second end EP2 thereof.

Referring to FIGS. 1A to 9F, after the light emitting elements LD are aligned, an insulating material layer INSM2 may be applied to the passivation layer PSV. The insulating material layer INSM2 may be applied not only to the upper surface of each light emitting element LD but also to a front surface of the passivation layer PSV. For example, the insulating material layer INSM2 may be formed of an organic insulating layer including an organic material, and spaces between the first insulating layer INS1 and the opposite ends EP1 and EP2 of each light emitting element LD may be filled with the insulating material layer INSM2.

Thereafter, an etching mask EM corresponding to each light emitting element LD may be disposed on the insulating material layer INSM2.

The etching mask EM may be formed of a material that is not affected by an etching gas to be used during an etching process and has a desired etching resistance. For example, the etching mask EM may include a conductive material or an inorganic insulating layer including an inorganic material. In an embodiment, the etching mask EM may function as a mask for successively etching the insulating material layer INSM2 and each light emitting element LD.

Referring to FIGS. 1A to 9G, a second insulating layer INS2 overlapping a portion of the upper surface of each of the light emitting elements LD may be formed by patterning the insulating material layer INSM2 using the etching mask EM. Therefore, the opposite ends EP1 and EP2 of each of the light emitting elements LD may be exposed to the outside. For example, in each light emitting element LD, an area A of the first end EP1 and an area B of the second end EP2, each of which protrudes outward in the longitudinal direction (L) of the light emitting element LD, may be exposed to the outside. In an embodiment, the area A of the first end EP1 may refer to a portion of the insulating film 14 that corresponds to the first end EP1, and the area B of the second end EP2 may refer to a portion of the insulating film 14 that corresponds to the second end EP2.

In an embodiment, the second insulating layer INS2 may be formed and/or provided not only on the upper surface of each of the light emitting elements LD but also between the first insulating layer INS1 and the opposite ends EP1 and EP2 of each light emitting element LD that are exposed to the outside. In detail, the second insulating layer INS2 may be formed and/or provided on a portion of the upper surface of each light emitting element LD, between the first insulating layer INS1 and the first end EP1 of each light emitting element LD, and between the first insulating layer INS1 and the second end EP2 of each light emitting element LD.

Since the second insulating layer INS2 is formed and/or provided between the first insulating layer INS1 and the opposite ends EP1 and EP2 of each light emitting element LD, an area in which each light emitting element LD is disposed may be planarized so that the light emitting element LD may be stably supported. Furthermore, a contact surface area between each light emitting element LD and electrodes (e.g., contact electrodes) electrically connected to the light emitting element LD may be further increased.

Referring to FIGS. 1A to 9H, the etching process using the etching mask EM is performed so that the insulating film 14 may be removed from the exposed area A of the first end EP1 of each light emitting element LD, and simultaneously, the insulating film 14 may be removed from the area B of the second end EP2.

In an embodiment, the etching process using the etching mask EM may be performed by a dry etching method using at least one etching gas selected from the group consisting of $BCl_3$, $SiCl_4$, $Cl_2$, HBr, $SF_6$, $CF_4$, $C_4F_8$, $CH_4$, $CHF_3$, $NF_3$, CFCs(chlorofluorocarbons), $H_2$, and $O_2$. Although at least one inert gas selected from the group consisting of $N_2$, Ar, and He may be added to the etching gas, the disclosure is not limited thereto.

Because of the foregoing etching process, the area 15_a of the electrode layer 15 that corresponds to the area A of the first end EP1 of each light emitting element LD may be exposed to the outside, and an area 11_a of the first conductive semiconductor layer 11 that corresponds to the area B of the second end EP2 of each light emitting element LD may be exposed to the outside.

After the area 11_a of the first conductive semiconductor layer 11 of each light emitting element LD and the area 15_a of the electrode layer 15 are exposed to the outside, the etching mask EM may be removed by a typical wet etching or dry etching method, but the disclosure is not limited thereto, and the area 11_a and the area 15_a may be removed by a typical removal method. In an embodiment, the etching mask EM may not be removed.

Referring to FIGS. 1A to 9I, after a portion of each light emitting element LD is exposed to the outside and a conductive layer (not illustrated) is formed on the front surface of the passivation layer PSV, the first and second contact electrodes CNE1 and CNE2 may be formed by patterning the conductive layer using a mask (not illustrated).

The first contact electrode CNE1 and the second contact electrode CNE2 may be spaced apart from each other by a predetermined distance on the second insulating layer INS2 and be electrically disconnected and/or physically separated from each other.

In an embodiment, the first contact electrode CNE1 may directly contact the area 15_a of the electrode layer 15 that is exposed outside each light emitting element LD, and the second contact electrode CNE2 may come into direct contact with the area 11_a of the first conductive semiconductor layer 11 that is exposed outside the light emitting element LD.

A portion of the first connection line CNL1 connected and/or provided in common to the sub-pixels SP1 to SP3 may be removed by the foregoing mask process so that each sub-pixel SP1, SP2, or SP3 can be driven independently from adjacent sub-pixels. Therefore, each sub-pixel SP1, SP2, or SP3 may be individually driven, and the display device in accordance with an embodiment may be implemented as an active matrix-type display device.

Referring to FIGS. 1A to 9J, the third insulating layer INS3 may be formed on the first and second contact electrodes CNE1 and CNE2.

In the display device manufactured through the foregoing manufacturing process, during a process of manufacturing the display element layer DPL, the partition wall PW is formed in the emission area EMA of each sub-pixel, and simultaneously, the bank BNK is formed on the non-emission area PPA of each sub-pixel. Therefore, the number of mask processes may be reduced.

Furthermore, in the above-described display device, during a process following alignment of the light emitting elements LD, a portion of the insulating film 14 disposed on each of the opposite ends EP1 and EP2 of the light emitting element LD is removed, so that contact surface areas of the first and second contact electrodes CNE1 and CNE2 that directly contact the light emitting elements LD may be further increased.

Figure 10:
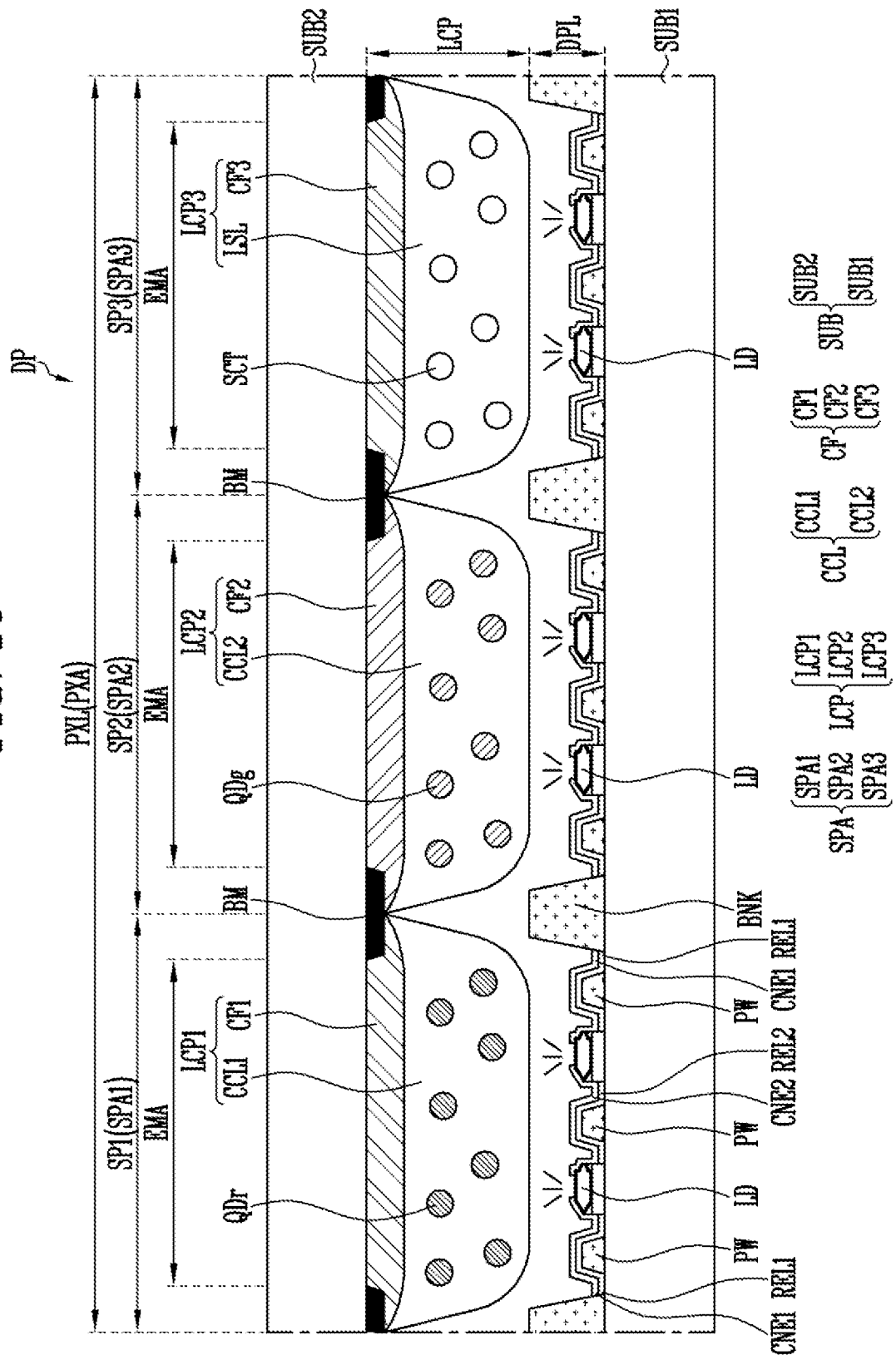
FIG. 10 illustrates a display device in accordance with an embodiment of the disclosure, and is a schematic cross-sectional view illustrating a color conversion layer connected to the display device of FIG. 5.

FIG. 10 illustrates a display device in accordance with an embodiment, and is a schematic cross-sectional view illustrating a structure of a color conversion layer connected to the display device of FIG. 5.

FIG. 10 schematically illustrates a pixel area of one of pixels included in the display device, for the convenience of explanation.

Furthermore, for the sake of convenience, FIG. 10 schematically illustrates structures of some components identical to those of the display device that have been described in detail with reference to FIGS. 5 to 9J, and detailed explanation thereof will be omitted.

Referring to FIGS. 1A to 10, the display device in accordance with an embodiment may include a display panel DP including a first substrate SUB1 on which at least one pixel PXL (hereinafter, referred to as "pixel") including first to third sub-pixels SP1 to SP3 is provided, and a second substrate SUB2 connected with the first substrate SUB1.

In an embodiment, the pixel PXL may be formed and/or provided in the pixel area PXA defined on the first substrate SUB1. The pixel area PXA may include sub-pixel areas SPA such as a first sub-pixel area SPA1 in which a first sub-pixel SP1 is formed and/or provided, a second sub-pixel area SPA2 in which a second sub-pixel SP2 is formed and/or provided, and a third sub-pixel area SP3 in which a third sub-pixel SPA3 is formed and/or provided.

In an embodiment, the first substrate SUB1 may include a base layer BSL, and a pixel circuit layer PCL provided on the base layer BSL. The display element layer DPL may be provided on the first substrate SUB1.

The display element layer DPL may include a partition wall PW, first and second electrodes REL1 and REL2, light emitting elements LD, and first and second contact electrodes CNE1 and CNE2 provided on the pixel circuit layer PCL of the emission area EMA of each of the first to third sub-pixels SP1, SP2, and SP3. Furthermore, the display element layer DPL may include a bank BNK provided in the non-emission area PPA of each of the first to third sub-pixels SP1, SP2, and SP3.

In an embodiment, the partition wall PW and the bank BNK may be provided on the same plane (or layer) and formed by the same process. In an embodiment, the first and second contact electrodes CNE1 and CNE2 may be provided on the same plane and formed by the same process.

Each of the light emitting elements LD may include opposite ends EP1 and EP2 protruding outward in the longitudinal direction (L).

The second substrate SUB2 may be disposed over the first substrate SUB1 to cover or overlap the display area DA in which the first to third sub-pixels SP1, SP2, and SP3 are disposed. The second substrate SUB2 may form an upper substrate (e.g., an encapsulation substrate or a thin-film encapsulation layer) of the display panel DP and/or a window component. In an embodiment, the second substrate SUB2 may be a rigid substrate or a flexible substrate, and the material or properties thereof are not particularly limited. Furthermore, the second substrate SUB2 and the first substrate SUB1 may be formed of the same material or different materials.

Furthermore, the display panel DP may include a light conversion pattern layer LCP disposed on a surface of the second substrate SUB2 to face the first to third sub-pixels SP1, SP2, and SP3 of the first substrate SUB1.

In an embodiment, the light conversion pattern layer LCP may include a first light conversion pattern layer LCP1 disposed to face the first sub-pixel SP1, a second light conversion pattern layer LCP2 disposed to face the second sub-pixel SP2, and a third light conversion pattern layer LCP3 disposed to face the third sub-pixel SP3. In an embodiment, at least some of the first, second, and third light conversion pattern layers LCP1, LCP2, and LCP3 may include a color conversion layer CCL and/or a color filter CF.

For example, the first light conversion pattern layer LCP1 may include a first color conversion layer CCL1 including first color conversion particles corresponding to a first color, and a first color filter CF1 configured to allow the first color of light to selectively pass therethrough. Likewise, the second light conversion pattern layer LCP2 may include a second color conversion layer CCL2 including second color conversion particles corresponding to a second color, and a second color filter CF2 configured to allow the second color of light to selectively pass therethrough. The third light conversion pattern layer LCP3 may include at least one of a light scattering layer LSL including light scattering particles SCT, and a third color filter CF3 configured to allow the third color of light to selectively pass therethrough.

In an embodiment, the light emitting elements LD aligned in the emission area EMA of each of the first to third sub-pixels SP1, SP2, and SP3 may emit light of the same color. For example, the light emitting elements LD aligned in the emission area EMA of each of the first to third sub-pixels SP1, SP2, and SP3 may emit blue light. A color conversion layer CCL may be disposed on at least some of the first, second, and third sub-pixels SP1, SP2, and SP3. For example, first and second color conversion layers CCL1 and CCL2 may be respectively disposed on the first and second sub-pixels SP1 and SP2. Therefore, the display device in accordance with an embodiment may display a full-color image.

In an embodiment, the first color conversion layer CCL1 may be disposed on a surface of the second substrate SUB2 to face the first sub-pixel SP1 and may include first color conversion particles which convert the color of light emitted from light emitting elements LD (hereinafter, referred to as "first light emitting elements") provided in the corresponding sub-pixel to a first color. For example, in the case where the first sub-pixel SP1 is a red sub-pixel, the first color conversion layer CCL1 may include red quantum dots QDr which convert blue light emitted from the first light emitting elements LD to red light.

The first color filter CF1 may be disposed between the first color conversion layer CCL1 and the second substrate SUB2 and may include color filter material which allows the first color of light converted by the first color conversion layer CCL1 to selectively pass therethrough. For example, the first color filter CF1 may be a red color filter.

In an embodiment, the second color conversion layer CCL2 may be disposed on a surface of the second substrate SUB2 to face the second sub-pixel SP2 and may include second color conversion particles which convert the color of light emitted from light emitting elements LD (hereinafter, referred to as "second light emitting elements") provided in the corresponding sub-pixel to a second color. For example, in the case where the second light emitting elements LD are blue light emitting elements configured to emit blue light and the second sub-pixel SP2 is a green sub-pixel, the second color conversion layer CCL2 may include green quantum dots QDg which convert blue light emitted from the second light emitting elements LD2 to green light.

The second color filter CF2 may be disposed between the second color conversion layer CCL2 and the second substrate SUB2 and may include color filter material which allows the second color of light converted by the second color conversion layer CCL2 to selectively pass therethrough. For example, the second color filter CF2 may be a green color filter.

The light scattering layer LSL may be disposed on a surface of the second substrate SUB2 to face the third sub-pixel SP3. For example, the light scattering layer LSL may be disposed between the third sub-pixel SP3 and the third color filter CF3.

The third color filter CF3 may be disposed on a surface of the second substrate SUB2 to face the third sub-pixel SP3 and may include color filter material which allows the color of light emitted from the light emitting elements LD formed in the corresponding sub-pixel to selectively pass therethrough. For example, the third color filter CF3 may be a blue color filter.

In an embodiment, a black matrix BM may be disposed between the first, second, and third color filters CF1, CF2, and CF3. For example, the black matrix BM may be disposed on the second substrate SUB2 to overlap the bank BNK on the first substrate SUB1.

As described above, in an embodiment, each pixel PXL using the light emitting elements LD for emitting light of the same, light and the display device including the same may be readily manufactured. Since the color conversion layer CCL is disposed on at least some of the sub-pixels, full-color pixels PXL and a display device including the same may be manufactured.

Furthermore, in accordance with an embodiment, some components of the display element layer DPL may be formed by the same process to reduce the number of masks, thereby simplifying the manufacturing process.

Moreover, in an embodiment, a portion of the insulating film 14 that covers or overlaps the surface of each of the light emitting elements LD may be selectively removed so that a valid contact surface area between each light emitting element LD and the electrodes that contacting the light emitting element LD can be increased, whereby contact defects of the light emitting elements LD may be minimized.

Figure 11:
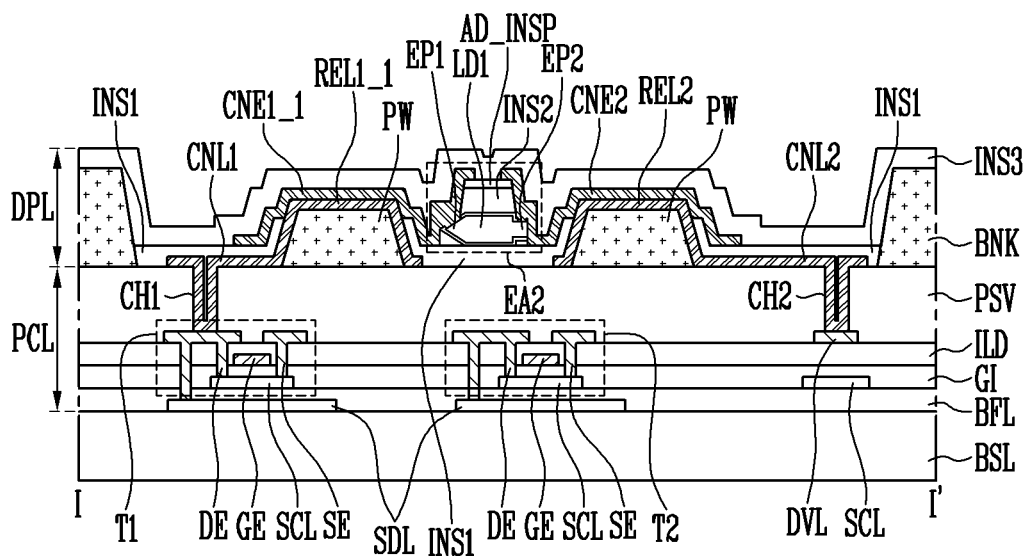
FIG. 11 schematically illustrates a display device in accordance with an embodiment of the disclosure and is a cross-sectional diagram corresponding to line I-I' of FIG. 4.
Figure 12:
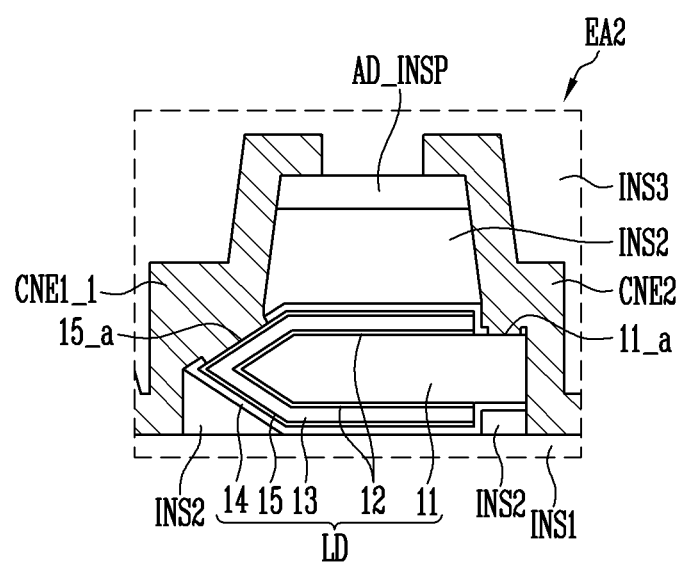
FIG. 12 is a schematic enlarged sectional view of area EA2 of FIG. 11.

FIG. 11 schematically illustrates a display device in accordance with an embodiment, and is a cross-sectional diagram taken along line I-I' of FIG. 4. FIG. 12 is a schematic enlarged sectional view of area EA2 of FIG. 11.

The configuration of the display device of FIGS. 11 and 12, other than a structure in which an additional insulating pattern is provided on the second insulating layer, may be substantially identical or similar to the display device of FIGS. 5 and 6A and 6B.

Therefore, to avoid repetitive explanation, the description of the display device of FIGS. 11 and 12 will be focused on differences from that of the foregoing embodiments. Components which are not separately explained in the following description of the embodiment may comply with that of the foregoing embodiments. The same reference numeral will be used to denote the same component, and a similar reference numeral will be used to denote a similar component.

Referring to FIGS. 1A, 2, 4, 11, and 12, the display device in accordance with an embodiment may include a base layer BSL on which pixels PXL are provided.

Each of the pixels PXL may include a first sub-pixel SP1, a second sub-pixel SP2, and a third sub-pixel SP3 provided on the base layer BSL. In an embodiment, the first sub-pixel SP1 may be a red sub-pixel, the second sub-pixel SP2 may be a green sub-pixel, and the third sub-pixel SP3 may be a blue sub-pixel.

A base layer BSL, a pixel circuit layer PCL, and a display element layer DPL may be provided in a pixel area of each of the first to third sub-pixel SP1 to SP3.

The display element layer DPL of each of the first to third sub-pixels SP1 to SP3 may include a partition wall PW, first and second electrodes REL1 and REL2, first and second connection lines CNL1 and CNL2, light emitting elements LD, and first and second contact electrodes CNE1 and CNE2 provided on the passivation layer PSV.

Each of the light emitting elements LD may include a first conductive semiconductor layer 11 disposed in a central portion of each light emitting element LD in the longitudinal direction (L), an active layer 12 which encloses at least one side of the first conductive semiconductor layer 11, and a second conductive semiconductor layer 13 which encloses the active layer 12. Furthermore, each of the light emitting elements LD may include an electrode layer 15 which encloses the second conductive semiconductor layer 13, and an insulating film 14 which encloses the electrode layer 15.

Each of the light emitting elements LD may include a first end EP1 and a second end EP2 each of which has a shape protruding outward in the longitudinal direction (L). In an embodiment, the electrode layer 15 may be disposed on the first end EP1 of each light emitting element LD, and the first conductive semiconductor layer 11 may be disposed on the second end EP2 thereof.

In an embodiment, each light emitting element LD may include an area 11_a of the first conductive semiconductor layer 11 and an area 15_a of the electrode layer 15, which are disposed on the opposite ends EP1 and EP2 of the light emitting element LD and are exposed to the outside.

A second insulating layer INS2 may be provided on the upper surface of each of the light emitting elements LD. The second insulating layer INS2 may be disposed not only on the upper surface of each of the light emitting elements LD but also between the first insulating layer INS1 and the opposite ends EP1 and EP2 of each light emitting element LD that are exposed to the outside.

An additional insulating pattern AD_INSP may be provided on the second insulating layer INS2. The additional insulating pattern AD_INSP may function as an etching mask for forming the second insulating layer INS2. For example, the additional insulating pattern AD_INSP and the etching mask EM illustrated in FIG. 9F may have the same configuration.

Furthermore, the additional insulating pattern AD_INSP may be an etching mask to be used to remove a portion of the insulating film 14 from each light emitting element LD, and may be formed of material which has a desired resistance to etching without being affected by etching gas to be used during an etching operation. In an embodiment, the additional insulating pattern AD_INSP may be formed of (or include) an inorganic insulating layer such as $SiO_x$. In the case where the additional insulating pattern AD_INSP is formed of material such as $SiO_x$, the insulating film 14 covering or overlapping the surface of each light emitting element LD may be formed of material such as $SiN_x$. In other words, the additional insulating pattern AD_INSP may be formed of materials which are different from the material of insulating film 14 and are not affected during an etching process of removing a portion of the insulating film 14.

As the additional insulating pattern AD_INSP is provided on the second insulating layer INS2, the additional insulating pattern AD_INSP may protect the light emitting element LD from external oxygen and water, minimizing defects of the light emitting element LD. Since the additional insulating pattern AD_INSP is provided on the second insulating layer INS2, the first and second contact electrodes CNE1 and CNE2 may be spaced apart from each other by a predetermined distance on the additional insulating pattern AD_INSP and electrically disconnected and/or physically separated from each other.

In an embodiment, the first contact electrode CNE1 and the second contact electrode CNE2 may be provided on the same layer and formed by the same process. Furthermore, the partition wall PW disposed in the emission area EMA of each sub-pixel SP1, SP2, or SP3 and the bank BNK disposed in the non-emission area PPA of each sub-pixel SP1, SP2, or SP3 may be provided on the same layer and formed by the same process.

Figure 13:
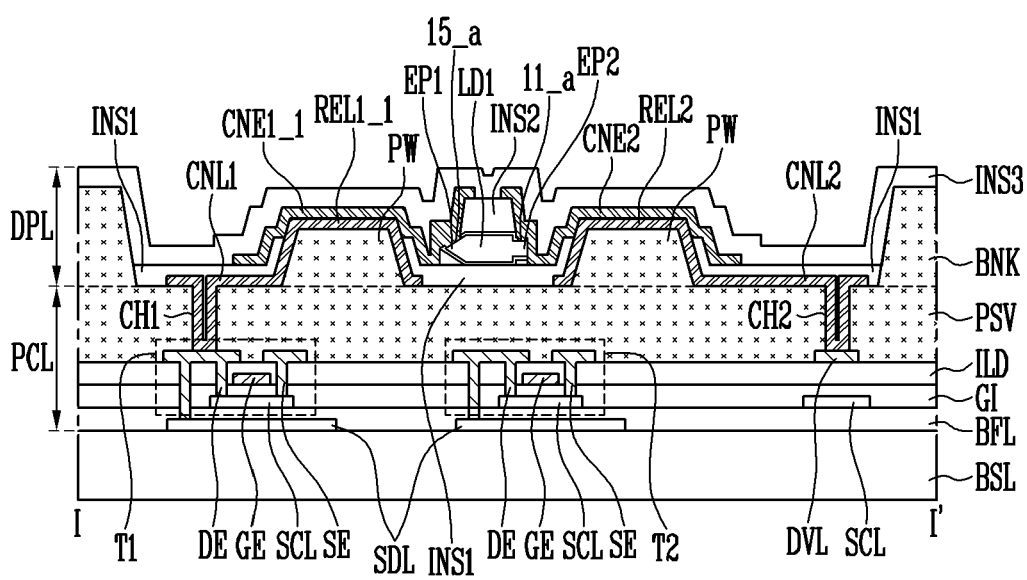
FIG. 13 schematically illustrates a display device in accordance with an embodiment of the disclosure and is a cross-sectional diagram corresponding to line I-I' of FIG. 4.

FIG. 13 schematically illustrates a display device in accordance with an embodiment and is a cross-sectional diagram taken along line I-I' of FIG. 4.

The configuration of the display device of FIG. 13, other than the structure in which a passivation layer, a partition wall, and a bank are provided on the same layer, may be substantially identical or similar to that of the display device of FIGS. 5 and 6A and 6B.

Therefore, to avoid redundant explanation, the description of the display device of FIG. 13 will be focused on differences from that of the foregoing embodiments. Components which are not separately explained in the following description of the embodiment may comply with that of the foregoing embodiments. The same reference numeral will be used to denote the same component, and a similar reference numeral will be used to denote a similar component.

Referring to FIGS. 1A, 2, 4, and 13, the display device in accordance with an embodiment may include a base layer BSL on which pixels PXL are provided.

Each of the pixels PXL may include a first sub-pixel SP1, a second sub-pixel SP2, and a third sub-pixel SP3 which are provided on the base layer BSL. In an embodiment, the first sub-pixel SP1 may be a red sub-pixel, the second sub-pixel SP2 may be a green sub-pixel, and the third sub-pixel SP3 may be a blue sub-pixel.

A base layer BSL, a pixel circuit layer PCL, and a display element layer DPL may be provided in the pixel area of each of the first to third sub-pixel SP1 to SP3.

The pixel circuit layer PCL may include a light shielding pattern SDL, first and second transistors T1 and T2, a driving voltage line DVL, and a passivation layer PSV which are provided on the base layer BSL.

The display element layer DPL may include a partition wall PW, first and second electrodes REL1 and REL2, first and second connection lines CNL1 and CNL2, light emitting elements LD, and first and second contact electrodes CNE1 and CNE2.

In an embodiment, the passivation layer PSV of the pixel circuit layer PCL, and the partition wall PW and the bank BNK of the display element layer DPL may be provided on the same layer and include the same material. In other words, the passivation layer PSV, the partition wall PW, and the bank BNK may be integrally provided by the same process.

The passivation layer PSV, the partition wall PW, and the bank BNK may be formed and/or provided in a target area in each sub-pixel SP1, SP2, and SP3 by applying an organic insulating layer (not illustrated) to the base layer BSL on which the first and second transistors T1 and T2 are formed and then patterning the organic insulating layer using a half-tone mask (not illustrated) or the like. For example, the passivation layer PSV may be formed and/or provided on the first and second transistors T1 and T2 in each sub-pixel SP1, SP2, and SP3. The partition wall PW may be formed and/or provided in the emission area EMA of each sub-pixel SP1, SP2, and SP3. The bank BNK may be formed and/or provided in the non-emission area PPA of each sub-pixel SP1, SP2, and SP3.

Figure 14:
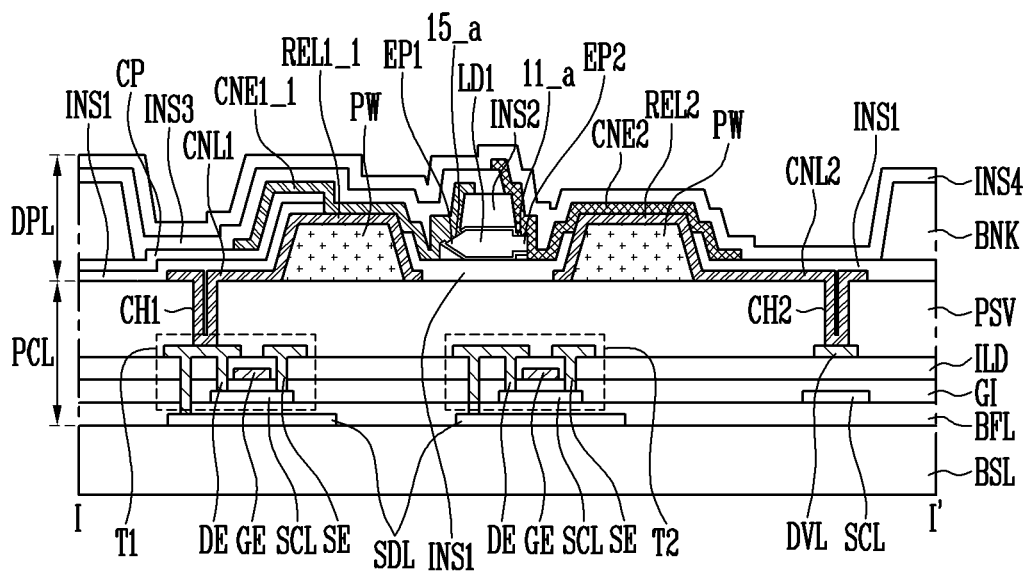
FIGS. 14 and 15 schematically illustrate a display device in accordance with an embodiment of the disclosure and are cross-sectional diagrams corresponding to line I-I' of FIG. 4.
Figure 15:
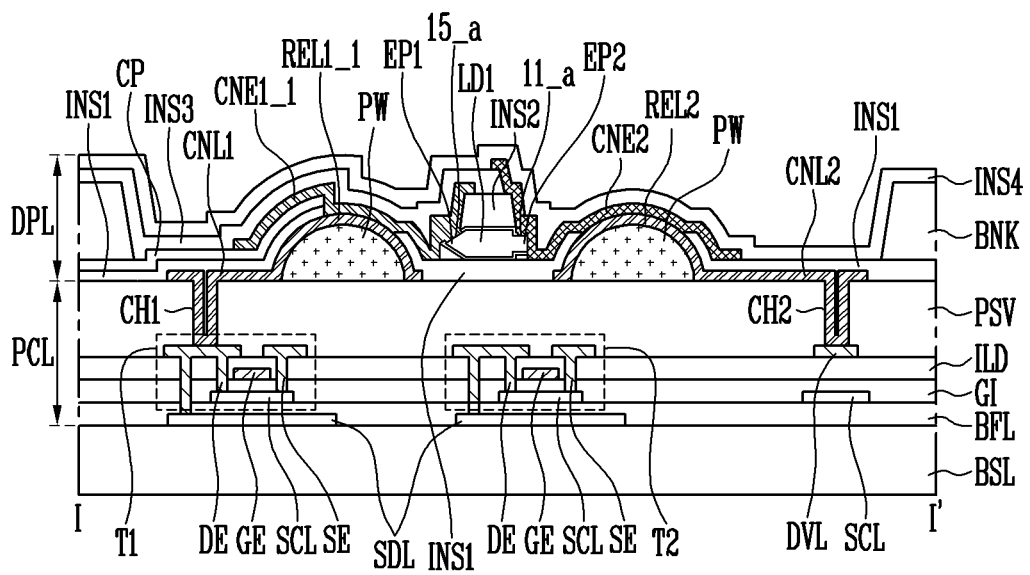

FIGS. 14 and 15 schematically illustrate a display device in accordance with an embodiment and are cross-sectional diagrams taken along line I-I' of FIG. 4.

The display device of FIG. 14, other than the structure in which first and second contact electrodes are disposed on different layers, may have a configuration substantially identical or similar to that of the display device of FIGS. 5 and 6A and 6B.

The display device of FIG. 15, other than the structure in which the partition wall has a semi-elliptical cross-sectional shape, may have a configuration substantially identical or similar to that of FIG. 14.

Therefore, to avoid repetitive explanations, the description of the display device of FIGS. 14 and 15 will be focused on differences from that of the foregoing embodiments. Components which are not separately explained in the following description of the embodiment may comply with that of the foregoing embodiments. The same reference numeral will be used to denote the same component, and a similar reference numeral will be used to denote a similar component.

Referring to FIGS. 1A, 2, 4, 14, and 15, the display device in accordance with an embodiment may include a base layer BSL on which pixels PXL are provided.

Each of the pixels PXL may include a first sub-pixel SP1, a second sub-pixel SP2, and a third sub-pixel SP3 which are provided on the base layer BSL. In an embodiment, the first sub-pixel SP1 may be a red sub-pixel, the second sub-pixel SP2 may be a green sub-pixel, and the third sub-pixel SP3 may be a blue sub-pixel.

A base layer BSL, a pixel circuit layer PCL, and a display element layer DPL may be provided in the pixel area of each of the first to third sub-pixel SP1 to SP3.

The display element layer DPL may include a partition wall PW, first and second electrodes REL1 and REL2, first and second connection lines CNL1 and CNL2, light emitting elements LD, and first and second contact electrodes CNE1 and CNE2 provided on the passivation layer PSV.

The partition wall PW may be spaced by a predetermined distance apart from another partition wall PW disposed adjacent thereto on the passivation layer PSV. Two adjacent partition walls PW may be disposed on the passivation layer PSV and spaced apart from each other by a length L of a light emitting element LD or greater. The partition wall PW may have a trapezoidal cross-section, the width of which reduces upward from a surface of the passivation layer PSV, as illustrated in FIG. 14. In an embodiment, as illustrated in FIG. 15, the partition wall PW may include a cross-sectional shape having a curved surface such as semicircle or semi-ellipse, the width of which reduces upward from a surface of the passivation layer PSV toward an upper portion of the partition wall PW, but the disclosure is not limited thereto.

In a cross-sectional view, the shape of the partition walls PW is not limited to the foregoing examples and may be changed in various ways within a range in which the efficiency of light emitted from each of the light emitting elements LD can be enhanced. The two adjacent partition walls PW may be disposed on the same plane (or layer) on the passivation layer PSV and have the same height.

The first and second electrodes REL1 and REL2 may be provided on the same plane and disposed on the corresponding partition walls PW. The first electrode REL1 and the second electrode REL2 may be spaced apart from each other by a predetermined distance and be electrically disconnected and/or physically separated from each other. The light emitting elements LD may be provided on the first insulating layer INS1 between the first electrode REL1 and the second electrode REL2.

Each of the light emitting elements LD may have a first end EP1 and a second end EP2 each of which has a shape protruding outward in the longitudinal direction (L). In an embodiment, the electrode layer 15 may be disposed on the first end EP1 of each light emitting element LD, and the first conductive semiconductor layer 11 may be disposed on the second end EP2 thereof.

In an embodiment, each light emitting element LD may include an area 11_a of the first conductive semiconductor layer 11 and an area 15_a of the electrode layer 15 which are disposed on the opposite ends EP1 and EP2 of the light emitting element LD and are exposed to the outside.

The second insulating layer INS2 may be provided on each of the light emitting elements LD. The second insulating layer INS2 may be formed and/or provided not only on the upper surface of each of the light emitting elements LD but also between the first insulating layer INS1 and the opposite ends EP1 and EP2 of each light emitting element LD that are exposed to the outside.

The first contact electrode CNE1 may be provided on a side of the second insulating layer INS2, one of the opposite ends EP1 and EP2 of each of the light emitting elements LD, and the first electrode REL1 to electrically and/or physically connect the end of each of the light emitting elements LD with the first electrode REL1 For example, the first contact electrode CNE1 may be disposed on the first end EP1 of each light emitting element LD and directly contact the area 15_a of the electrode layer 15 that is exposed to the outside.

A third insulating layer INS3 may be provided on the first contact electrode CNE1 to cover or overlap the first contact electrode CNE1, thereby preventing the first contact electrode CNE1 from corroding. Here, the second electrode REL2 and the other end of the opposite ends EP1 and EP2 of each of the light emitting elements LD may be exposed to the outside rather than being overlapping by the third insulating layer INS3.

The second contact electrode CNE2 may be provided on the exposed second electrode REL2 and the exposed other end of the opposite ends EP1 and EP2 of each of the light emitting elements LD to electrically and/or physically connect the exposed other end of each of the light emitting elements LD with the second electrode REL2. For example, the second contact electrode CNE2 may be disposed on the second end EP2 of each light emitting element LD and may directly contact the area 11_a of the first conductive semiconductor layer 11 that is exposed to the outside.

A fourth insulating layer INS4 may be provided on the second contact electrode CNE2 to overlap the second contact electrode CNE2, thereby preventing the second contact electrode CNE2 from being corroded.

The display element layer DPL may further include a conductive pattern CP disposed on the first insulating layer INS1 on the passivation layer PSV, and a bank BNK disposed in the non-emission area PPA of each of the first to third sub-pixels SP1, SP2, and SP3.

In an embodiment, the conductive pattern CP may be provided on the first electrode REL1 with the first insulating layer INS1 interposed therebetween. The conductive pattern CP may function to align the light emitting elements LD in the emission area EMA of each sub-pixel. The conductive pattern CP may offset an electric field generated between the respective emission areas EMA of two adjacent sub-pixels so that the light emitting elements LD can be prevented from being aligned outside the emission areas EMA of the corresponding sub-pixels.

The bank BNK may be provided in the non-emission area PPA of each of the first to third sub-pixels SP1, SP2, and SP3. The bank BNK and the partition wall PW may be disposed on different layers. The bank BNK may be formed and/or provided in the non-emission area PPA between adjacent sub-pixels SP1, SP2, and SP3 to define the emission area EMA of the sub-pixels SP1, SP2, and SP3. The bank BNK and the partition wall PW may be formed of the same material, but the disclosure is not limited thereto.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the claimed invention must be defined by the accompanying claims.

What is claimed is:

1. A display device comprising: a substrate including a display area and a non-display area; and a plurality of pixels disposed on the display area, each of the plurality of pixels including a plurality of sub-pixels, wherein each of the plurality of sub-pixels comprises a pixel circuit layer, and a display element layer including at least one light emitting element emitting light, the display element layer comprises: a first electrode and a second electrode spaced apart from each other; a first insulating layer disposed between the pixel circuit layer and the at least one light emitting element; and a second insulating layer disposed on the at least one light emitting element and filling spaces between the first insulating layer and ends of the at least one light emitting element, the at least one light emitting element comprises: a first semiconductor layer; an active layer enclosing at least one side of the first semiconductor layer; a second semiconductor layer enclosing the active layer, an electrode layer enclosing the second semiconductor layer; and an insulating film covering an outer circumferential surface of the electrode layer, and a portion of the first semiconductor layer and a portion of the electrode layer are not covered by the insulating film.

2. The display device according to claim 1, wherein
the first semiconductor layer comprises at least one n-type semiconductor layer, and
the second semiconductor layer comprises at least one p-type semiconductor layer.

3. The display device according to claim 1, wherein the display element layer comprises:
a first contact electrode electrically connecting the first electrode with one of the ends of the at least one light emitting element; and
a second contact electrode electrically connecting the second electrode with another one of the ends of the at least one light emitting element.

4. The display device according to claim 3, wherein
the first contact electrode contacts one of the portion of the electrode layer and the portion of the first semiconductor layer, and
the second contact electrode contacts the other one of the portion of the electrode layer and the portion of the first semiconductor layer.

5. The display device according to claim 4, wherein the first and the second contact electrodes are disposed on a same layer, are spaced apart from each other on the second insulating layer, and are electrically insulated from each other.

6. The display device according to claim 5, wherein the second insulating layer is formed of an organic insulating layer including an organic material.

7. The display device according to claim 6, wherein the display element layer includes an insulating pattern disposed between the second insulating layer and the first and the second contact electrodes.

8. The display device according to claim 7, wherein the insulating pattern includes a material different from a material of the second insulating layer and a material of the insulating film.

9. The display device according to claim 3, wherein
the display element layer comprises a third insulating layer disposed on the first contact electrode, and a fourth insulating layer disposed on the second contact electrode, and
the first contact electrode and the second contact electrode are disposed on different layers and electrically insulated from each other.

10. The display device according to claim 3, wherein the display element layer comprises:
a wall disposed between the pixel circuit layer and the first and the second electrodes; and a bank disposed on the pixel circuit layer and between the plurality of sub-pixels and enclosing an emission area of each of the plurality of sub-pixels, and
the bank and the wall are disposed on a same layer and include a same material, wherein
the wall is disposed between a portion of the first contact electrode and the display element layer, the wall is also disposed between a portion of the second contact electrode and the display element layer.

11. The display device according to claim 10, further comprising:
a color conversion layer disposed on the display element layer, the color conversion layer including color conversion particles converting the light to light having a specific color; and
another substrate disposed on the color conversion layer.

12. The display device according to claim 1, wherein
the first electrode and the second electrode are electrically disconnected from each other, and
one of the first and the second electrodes has a shape enclosing the other one of the first and second electrodes.

13. The display device according to claim 1, wherein the at least one light emitting element comprises a light emitting diode having a shape of a polyprism having a micro-scale or nano-scale size.

14. The display device according to claim 13, wherein the pixel circuit layer comprises at least one transistor electrically connected to the at least one light emitting element.

15. A method of manufacturing a display device, comprising:
providing a base layer comprising a plurality of sub-pixels each including an emission area and a non-emission area; and
forming, on the base layer, a display element layer emitting light from the emission area of each of the plurality of sub-pixels,
wherein the forming of the display element layer comprises:
forming first and second electrodes spaced apart from each other in the emission area of each of the plurality of sub-pixels;
forming a first insulating layer exposing a portion of an upper surface each of the first and the second electrodes;
aligning a plurality of light emitting elements between the first and the second electrodes by respectively applying corresponding alignment voltages to the first and the second electrodes;
forming a second insulating layer exposing ends of each of the plurality of light emitting elements by depositing an insulating material layer on the plurality of light emitting elements and then etching the insulating material layer by using a mask;
exposing a portion of an electrode layer disposed on the ends of each of the plurality of light emitting elements and a portion of a first semiconductor layer by using the second insulating layer as an etching mask to remove an insulating film disposed on the exposed ends of each of the plurality of light emitting elements; and
forming a first contact electrode and a second contact electrode on the second insulating layer.

16. The method according to claim 15, wherein each of the plurality of light emitting elements comprises:
the first semiconductor layer;

an active layer enclosing at least one side of the first semiconductor layer;

a second semiconductor layer enclosing the active layer;

the electrode layer enclosing the second semiconductor layer; and the insulating film covering an outer circumferential surface of the electrode layer, and the exposed portion of the electrode layer and the exposed portion of the first semiconductor layer are not covered by the insulating film.

17. The method according to claim 16, wherein the first semiconductor layer comprises at least one n-type semiconductor layer, and the second semiconductor layer includes at least one p-type semiconductor layer.

18. The method according to claim 17, wherein the first contact electrode contacts the first electrode and any one of the exposed portion of the electrode layer and the exposed portion of the first semiconductor layer, and the second contact electrode contacts the second electrode and the other one of the exposed portion of the electrode layer and the exposed portion of the first semiconductor layer.

19. The method according to claim 17, wherein the forming of the second insulating layer comprises disposing the second insulating layer on each of the plurality of light emitting elements and filling spaces between the first insulating layer and the ends of each of the plurality of light emitting elements with the second insulating layer.

20. The method according to claim 19, further comprising before the forming of the first and second electrodes:

forming a wall in the emission area of each of the plurality of sub-pixels; and simultaneously forming, between the plurality of sub-pixels, a bank enclosing the emission area of each of the plurality of sub-pixels in the non-emission area of each of the plurality of sub-pixels, wherein the wall and the bank are disposed on a same layer.

21. The display device according to claim 1, wherein the portion of the first semiconductor layer and the portion of the electrode layer not covered by the insulating film are on a top side of the at least one light emitting element which faces away from the substrate and faces away from the pixel circuit layer.

22. The display device according to claim 1, wherein each of the at least one light emitting element has a core-shell structure and having a polypyramidal shape, the first semiconductor layer is disposed in a central area of each of the at least one light emitting element, and the first semiconductor layer being enclosed sequentially by the active layer, the second semiconductive layer, the electrode layer and the insulating film.

23. The display device according to claim 1, wherein the electrode layer is disposed between the second semiconductor layer and the insulating film.

* * * * *